(12) United States Patent
Yoo et al.

(10) Patent No.: US 12,201,003 B2
(45) Date of Patent: Jan. 14, 2025

(54) DISPLAY DEVICE AND TOUCH INPUT SYSTEM INCLUDING THE SAME

(71) Applicant: SAMSUNG DISPLAY CO., LTD., Yongin-si (KR)

(72) Inventors: Gi Na Yoo, Yongin-si (KR); Ju Yeon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/497,147

(22) Filed: Oct. 30, 2023

(65) Prior Publication Data
US 2024/0365635 A1  Oct. 31, 2024

(30) Foreign Application Priority Data
Apr. 27, 2023 (KR) .................. 10-2023-0055704

(51) Int. Cl.
*H10K 59/40* (2023.01)
*G06F 3/041* (2006.01)
*G06F 3/044* (2006.01)
*H10K 59/65* (2023.01)
*H10K 59/80* (2023.01)

(52) U.S. Cl.
CPC ........... *H10K 59/40* (2023.02); *G06F 3/0418* (2013.01); *G06F 3/0442* (2019.05); *H10K 59/65* (2023.02); *H10K 59/873* (2023.02); *H10K 59/8792* (2023.02); *G06F 2203/04108* (2013.01)

(58) Field of Classification Search
CPC ........ G06F 3/0442; G06F 2203/04108; H10K 59/65; H10K 59/873; H10K 59/8792
See application file for complete search history.

(56) References Cited

U.S. PATENT DOCUMENTS

| | | | |
|---|---|---|---|
| 2021/0098552 A1* | 4/2021 | Kang | ............... H10K 59/131 |
| 2022/0229514 A1 | 7/2022 | Park | |
| 2023/0023671 A1 | 1/2023 | Shim et al. | |

FOREIGN PATENT DOCUMENTS

| | | |
|---|---|---|
| KR | 10-2022-0106259 | 7/2022 |
| KR | 10-2023-0016737 | 2/2023 |

* cited by examiner

*Primary Examiner* — Abbas I Abdulselam
(74) *Attorney, Agent, or Firm* — F. CHAU & ASSOCIATES, LLC

(57) ABSTRACT

A display panel of a display device includes emission areas and a non-emission area between adjacent ones of the emission areas. A sensing electrode is disposed on the non-emission area of the display panel. A light blocking member is disposed on a portion of the sensing electrode. The light blocking member absorbs light of a specific wavelength, and another portion of the sensing electrode that does not overlap with the light blocking member reflects light of the specific wavelength. When viewed on a plane, the light blocking member includes a first part and a second part having different line widths in a first direction.

25 Claims, 19 Drawing Sheets

DISPLAY DEVICE AND TOUCH INPUT SYSTEM INCLUDING THE SAME

CROSS-REFERENCE TO RELATED APPLICATION

The application claims priority to and the benefit of Korean Patent Application No. 10-2023-0055704, filed Apr. 27, 2023, which is hereby incorporated by reference for all purposes as if fully set forth herein.

BACKGROUND

1. Technical Field

Embodiments of the present invention relate to a display device and a touch input system including the same.

2. Description of the Related Art

Display devices are included in many types of electronic devices. Examples include smart phones, digital cameras, notebook computers, navigation devices, and smart televisions. These display devices may be flat panel devices such as liquid crystal display devices, field emission display devices, organic light emitting display devices, and the like. In some flat panel display devices, each pixel may include a light emitting element capable of self-emitting light. In such a case, images can be displayed without use of a backlight unit in a display panel.

In many of the aforementioned display devices, inputs are made using a part of a user's body (for example, a finger) or by using an input pen. When inputs are made using an input pen, the display device may sense the inputs more precisely compared with inputs made using part of a user's body.

SUMMARY

One or more embodiments provide a display device capable of performing a function based on corresponding accurate input coordinates. This may be accomplished by generating input coordinate data of an input device without having to perform complex calculations and corrections when an input to the display device is determined using an input device. The present invention also provides a touch input system including the same.

Technical problems to be solved by the present invention are not limited to the technical problem mentioned above, and other technical problems not mentioned will be clearly understood by those skilled in the art from the following description.

In order to solve the above technical problems, a display device according to embodiments of the present invention may include a display panel including emission areas each emitting light and a non-emission area between adjacent ones of the emission areas; a sensing electrode disposed on the non-emission area of the display panel; and a light blocking member disposed on a portion of the sensing electrode. The light blocking member may absorb light of a specific wavelength, and another portion of the sensing electrode that does not overlap with the light blocking member may reflect light of the specific wavelength. The light blocking member may include a first part and a second part having different line widths in a first direction when viewed on a plane.

The light blocking member may absorb an infrared ray and the sensing electrode may reflect an infrared ray.

The light blocking member may have a mesh structure that does not overlap with the emission areas of the display panel and surrounds at least one of the emission areas when viewed on a plane.

The light blocking member may be a code pattern having location information determined by an arrangement of the light blocking member.

The code pattern may include a first code pattern and a second code pattern formed to overlap each other, and a size of the first code pattern may be smaller than a size of the second code pattern when viewed on a plane, and a line width of the first code pattern may be larger than a line width of the second code pattern.

The second code pattern may include a closed loop surrounding at least one of the emission areas when viewed on a plane, and the first code pattern may not include a closed loop.

A center of an area of the first code pattern and a center of an area of the second code pattern may be the same when viewed on a plane.

A center of an area of the first code pattern and a center of an area of the second code pattern may be different from each other when viewed on a plane.

A plurality of light blocking members including the light blocking member may be substantially arranged in rows and columns when viewed on a plane, and the location information may be determined by an arrangement position of the light blocking members with respect to virtual lines corresponding to the rows and columns.

Based on a virtual line closest to the light blocking member among the virtual lines, the first code pattern and the second code pattern may be located in the same direction and may be spaced apart from the virtual line by the same distance.

Based on a virtual line closest to the light blocking member among the virtual lines, the first code pattern and the second code pattern may be located in the same direction and may be spaced apart from the virtual line by different distances.

Each of the first code pattern and the second code pattern may include a closed loop surrounding at least one of the emission areas when viewed on a plane.

The display panel may include a substrate; a transistor disposed on the substrate; a light emitting element disposed on the transistor; and an encapsulation layer disposed on the substrate to cover the light emitting element. The sensing electrode may be disposed on the encapsulation layer.

The light blocking member may be disposed directly on the sensing electrode.

In accordance with one or more embodiments, a touch input system according to embodiments of the present invention may include a display device displaying an image; and an input device inputting a touch to the display device. The display device may include a display panel including emission areas each emitting light and a non-emission area between adjacent ones of the emission areas; a sensing electrode disposed on the non-emission area of the display panel; and light blocking members disposed on a portion of the sensing electrode and spaced apart from each other. Each of the light blocking members may include a first part and a second part having different line widths in a first direction when viewed on a plane. The input device may capture an image of some of the light blocking members, and transmit location information determined by an arrangement of some of the light blocking members to the display device.

The light blocking members may absorb an infrared ray, and another portion of the sensing electrode that does not overlap with the light blocking members may reflect an infrared ray. The input device may capture the image of some of the light blocking members using an infrared ray.

The input device may include a camera capturing the image of some of the light blocking members; a processor obtaining the location information by analyzing the image of some of the light blocking members; and a communication module transmitting the location information to the display device.

The display device may further include a communication unit receiving the location information from the communication module; and a main processor generating image data based on the location information. The display panel may display an image based on the image data.

Each of the light blocking members may include a first light blocking member having a first line width and a second light blocking member having a second line width smaller than the first line width, and a size of the first light blocking member may be smaller than a size of the second light blocking member when viewed on a plane.

In a state in which the input device is in contact with the display device, the input device may obtain the location information based substantially only on the first light blocking member. In a state in which the input device is spaced apart from the display device, the input device may obtain the location information based on the first light blocking member and the second light blocking member.

In accordance with one or more embodiments, a display device includes a display panel including emission areas and non-emission areas; a code pattern disposed on at least one of the non-emission areas, wherein the code pattern includes a first code overlapping a second code, the first code corresponding to a first light blocking area and the second code corresponding to a second light blocking area have a size different from the first light blocking area, a position of the first light blocking area and a position of a second light blocking area relative to at least one reference line indicative of a position value.

The first code may have a first center, the second code may have a second center, and the first center may be coincident with the second center. The first code may have a first center, the second code may have a second center, and the first center and the second center area may have different locations. The first light blocking area may be between at least two adjacent emission areas of a pixel. The second light blocking area surrounds the at least two adjacent emission areas of the pixel.

Details of other embodiments are included in the detailed description and drawings.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
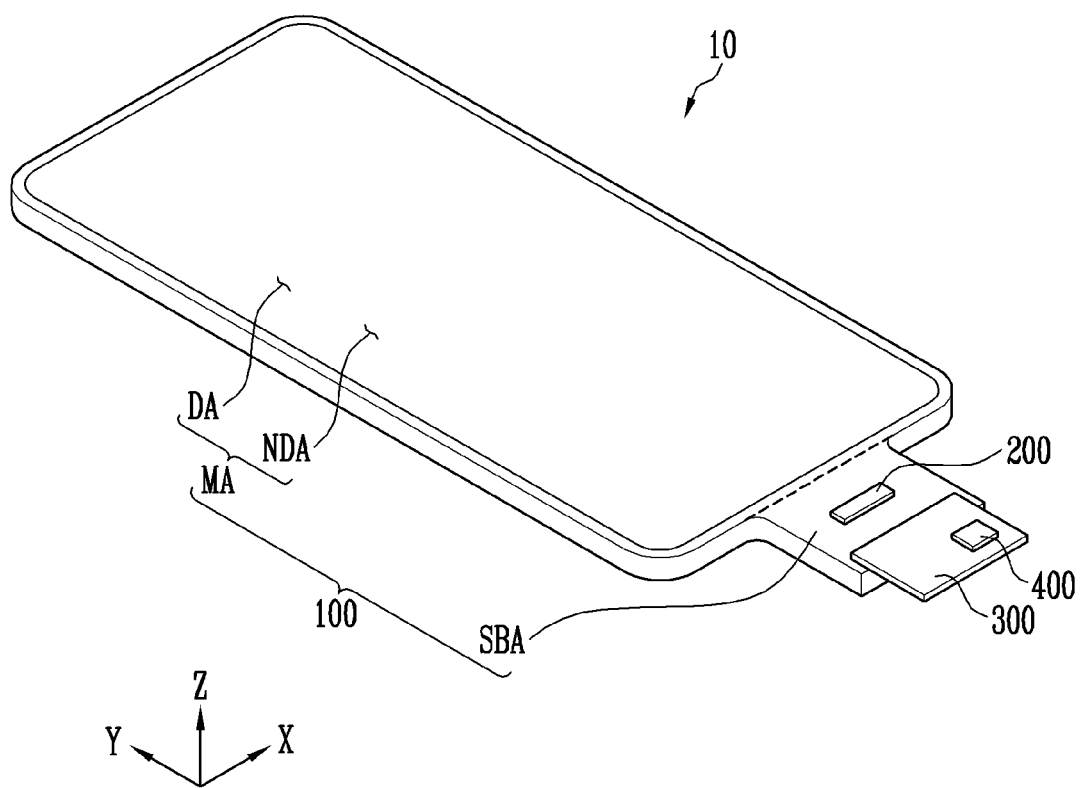
FIG. 1 is a perspective view illustrating a display device according to an embodiment.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the present invention. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof. In addition, when a first part such as a layer, film, region, plat, etc. is "on" a second part, the first part may be not only "directly on" the second part but a third part may intervene between them. Furthermore, in the disclosure, when a first part such as a layer, film, region, plat, etc. is formed on a second part, a direction in which the first part is formed is not limited to an upper direction of the second part, but may include a side or a lower direction of the second part. To the contrary, when a first part such as a layer, film, region, plat, etc. is "under" a second part, the first part may be not only "directly under" the second part but also a third part may intervene between them.

Advantages and features of the present invention and methods of achieving them will become apparent with reference to the embodiments described below in detail in conjunction with the accompanying drawings. However, the present invention is not limited to the embodiments disclosed below and may be implemented in various different forms. In the following description, when a first part is connected to a second part, this includes not only the case where the first part is directly connected to the second part, but also the case where a third part is interposed therebetween and they are electrically connected to each other. In embodiments of the present invention, "connection" between two components may mean to encompass both an electrical connection and a physical connection.

Hereinafter, a display device according to embodiments of the present invention will be described with reference to drawings related to embodiments of the present invention.

FIG. 1 is a perspective view illustrating a display device 10 according to an embodiment.

Referring to FIG. 1, the display device 10 may be applied to portable electronic devices such as a mobile phone, a smart phone, a tablet personal computer (tablet PC), a mobile communication terminal, an electronic notebook, an electronic book, a portable multimedia player (PMP), a navigation device, and an ultra-mobile PC (UMPC). For example, the display device 10 may be applied as a display unit of other types of electronic devices, including but not limited to, televisions, laptop computers, monitors, electronic billboards, or Internet of Things (IoT). As other examples, the display device 10 may be applied to wearable devices such as a smart watch, a watch phone, a glasses-type display, and a head mounted display (HMD).

The display device 10 may have a planar shape similar such as a rectangle. For example, the display device 10 may have a planar shape similar to a rectangle having a short side in an X-axis direction and a long side in a Y-axis direction. A corner portion where the short side in the X-axis direction and the long side in the Y-axis direction meet may be formed round to have a predetermined curvature or formed at a right angle. The planar shape of the display device 10 may not be limited to a rectangle. For example, the planar shape of the display device 10 may be formed to have a shape similar to a polygon, a circle, or an ellipse.

The display device 10 may include a display panel 100, a display driver 200, a circuit board 300, and a touch driver 400.

The display panel 100 may include a main area MA and a sub area SBA. The main area MA may include a display area DA and a non-display area. The display area DA includes pixels that emit light to display an image. The non-display area NDA is disposed partially or completely around the display area DA. The display area DA may emit light from a plurality of emission areas or a plurality of opening areas. For example, each pixel of the display panel 100 may include a pixel circuit including switching elements, a pixel defining layer defining an emission area or an opening area, and a self-light emitting element.

For example, the self-light emitting element may include at least one of an organic light emitting diode including an organic light emitting layer, a quantum dot light emitting diode including a quantum dot light emitting layer, an inorganic light emitting diode including an inorganic semiconductor, or a micro light emitting diode (Micro LED), but the present invention is not limited thereto.

The non-display area NDA may be an area outside the display area DA. The non-display area NDA may be defined as an edge area of the main area MA of the display panel 100. The non-display area NDA may include a gate driver supplying gate signals to gate lines and fan outline lines connecting the display driver 200 and the display area DA.

The sub area SBA may extend from one side of the main area MA. The sub area SBA may include a flexible material capable of being bent, folded, or rolled. For example, when the sub area SBA is bent, the sub area SBA may overlap the main area MA in a thickness direction (Z-axis direction). The sub area SBA may include a pad unit connected to the display driver 200 and the circuit board 300. In one embodiment, the sub area SBA may be omitted, and the display driver 200 and the pad unit may be disposed in the non-display area NDA.

The display driver 200 may output signals and voltages for driving the display panel 100. The display driver 200 may supply data voltages to data lines. In one embodiment, the display driver 200 may supply a power source voltage to a power source line and may supply a gate control signal to the gate driver. The display driver 200 may be formed of an integrated circuit (IC) and mounted on the display panel 100 by a chip-on-glass (COG) method, a chip-on-plastic (COP) method, or an ultrasonic bonding method. For example, the display driver 200 may be disposed in the sub area SBA, and may overlap the main area MA in the thickness direction (Z-axis direction) by bending the sub area SBA. For another example, the display driver 200 may be mounted on the circuit board 300.

The circuit board 300 may be attached to the pad unit of the display panel 100 by an anisotropic conductive film (ACF). Lead lines of the circuit board 300 may be electrically connected to the pad unit of the display panel 100. The circuit board 300 may be a flexible printed circuit board, a printed circuit board, or a flexible film such as a chip-on-film.

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and sense a change amount of capacitance between the plurality of touch electrodes. For example, the touch driving signal may be a pulse signal having a predetermined frequency. The touch driver 400 may sense whether there is an input based on the amount by which the capacitance between the plurality of touch electrodes changes and then may calculate corresponding input coordinates. The touch driver 400 may be formed of an integrated circuit (IC).

Figure 2:
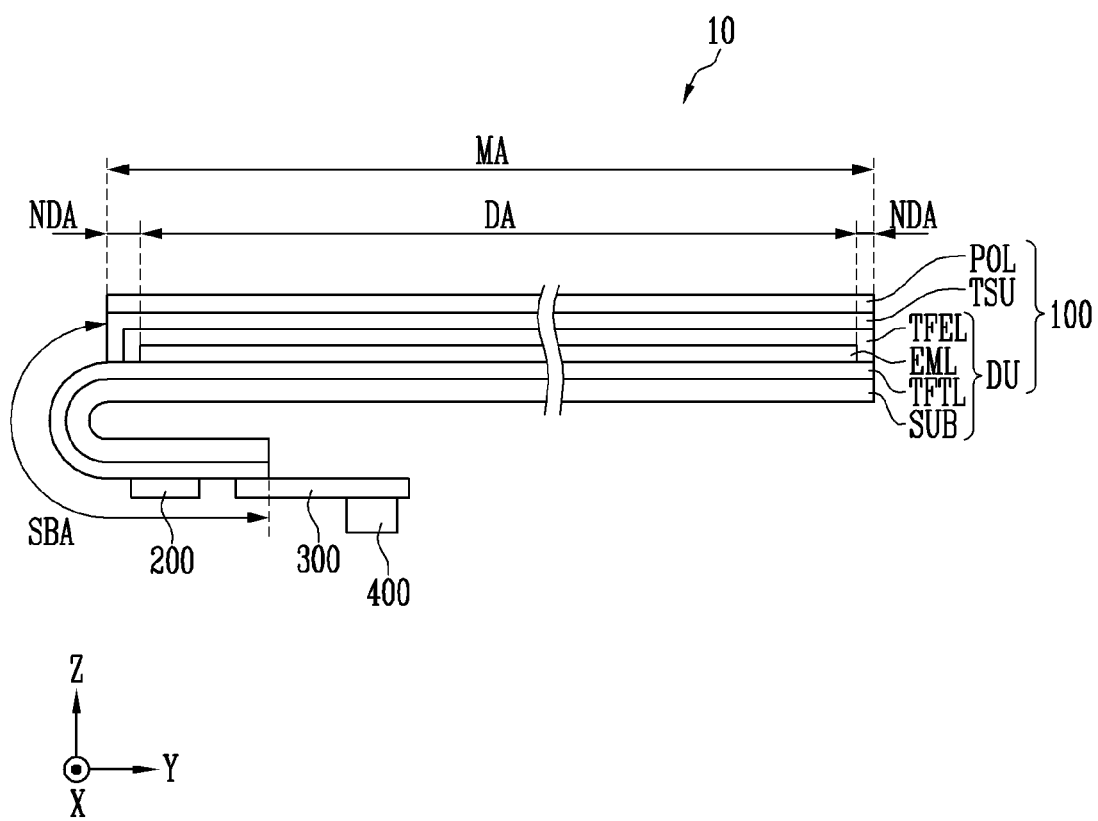
FIG. 2 is a cross-sectional view illustrating an embodiment of the display device of FIG. 1.

FIG. 2 is a cross-sectional view illustrating an embodiment of the display device of FIG. 1.

Referring to FIG. 2, the display panel 100 may include a display unit DU, a touch sensing unit TSU, and a polarizing film POL. The display unit DU may include a substrate SUB, a transistor layer TFTL, a light emitting element layer EML, and an encapsulation layer TFEL. The substrate SUB may be a base substrate or a base member. The substrate SUB may be a flexible substrate capable of being bent, folded, or rolled. For example, the substrate SUB may include a polymer resin such as polyimide (PI), but the present invention is not limited thereto. In another example, the substrate SUB may include a glass material or a metal material.

The transistor layer TFTL (or thin film transistor layer) may be disposed on the substrate SUB. The transistor layer TFTL may include a plurality of transistors (or thin film transistors) constituting a pixel circuit of each pixel. The transistor layer TFTL may further include gate lines, data lines, power source lines, gate control lines, fan out lines connecting the display driver 200 and the data lines, and lead lines connecting the display driver 200 and the pad unit. Each of the transistors may include a semiconductor region, a source electrode, a drain electrode, and a gate electrode. For example, when the gate driver is formed on one side of the non-display area NDA of the display panel 100, the gate driver may include transistors.

The transistor layer TFTL may be disposed in the display area DA, the non-display area NDA, and the sub area SBA. In the transistor layer TFTL, the transistors of each of the pixels, the gate lines, the data lines, and the power source lines may be disposed in the display area DA. In the transistor layer TFTL, the gate control lines and the fan out lines may be disposed in the non-display area NDA. In the transistor layer TFTL, the lead lines may be disposed in the sub area SBA.

The light emitting element layer EML may be disposed on the transistor layer TFTL. The light emitting element layer EML may include a plurality of light emitting elements and pixel defining layers. Each of the plurality of light emitting elements includes a first electrode, a light emitting layer, and a second electrode that are sequentially stacked and emit light. The pixel defining layers define corresponding ones of the pixels. The plurality of light emitting elements of the light emitting element layer EML may be disposed in the display area DA.

For example, the light emitting layer may be an organic light emitting layer including an organic material. The light emitting layer may include a hole transport layer, an organic light emitting layer, and an electron transport layer. When the first electrode receives a predetermined voltage through a transistor of the transistor layer TFTL and the second electrode receives a cathode voltage, holes and electrons may move to the organic light emitting layer through the hole transport layer and the electron transport layer, respectively. The holes and electrons combine with each other in the organic light emitting layer to induce the emission of light. For example, the first electrode may be an anode electrode and the second electrode may be a cathode electrode, but the present invention is not limited thereto.

For another example, the plurality of light emitting elements may include a quantum dot light emitting diode including a quantum dot light emitting layer, an inorganic light emitting diode including an inorganic semiconductor, or a micro light emitting diode.

The encapsulation layer TFEL may cover upper and side surfaces of the light emitting element layer EML and may protect the light emitting element layer EML. The encapsulation layer TFEL may include at least one inorganic layer and at least one organic layer for encapsulating the light emitting element layer EML.

The touch sensing unit TSU (or input sensing unit) may be disposed on the encapsulation layer TFEL. The touch sensing unit TSU may include a plurality of touch electrodes and touch lines. The plurality of touch electrodes sense a user's touch in a capacitive manner. The touch lines connect the plurality of touch electrodes and the touch driver 400. For example, the touch sensing unit TSU may sense a user's touch in a mutual capacitance method or a self-capacitance method.

For another example, the touch sensing unit TSU may be disposed on a separate substrate disposed on the display unit DU. In this case, the substrate supporting the touch sensing unit TSU may be a base member that encapsulates the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The polarizing film POL may be disposed on the touch sensing unit TSU. The polarizing film POL may be attached on the touch sensing unit TSU by an optically clear adhesive film (OCA film) or an optically clear resin (OCR). For example, the polarizing film POL may include a phase retardation film, such as a linear polarizer and a λ/4 wave plate (Quarter-Wave Plate). The phase retardation film and the linear polarizer may be sequentially stacked on the touch sensing unit TSU.

Figure 3:
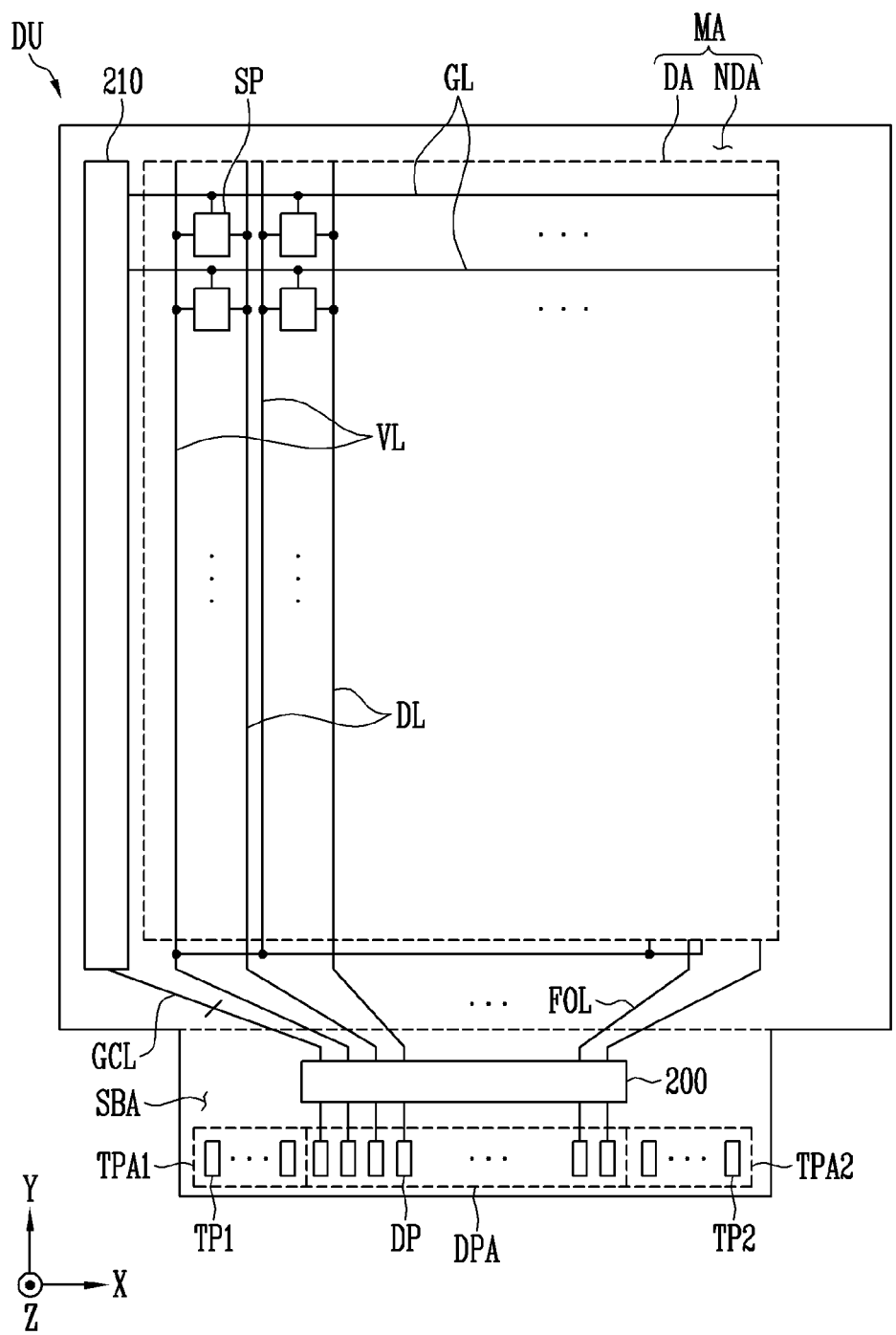
FIG. 3 is a plan view illustrating an embodiment of a display unit of the display device of FIG. 2.

FIG. 3 is a plan view illustrating an embodiment of a display unit DU of the display device of FIG. 2.

Referring to FIG. 3, the display unit DU may include the display area DA and the non-display area NDA. The display area DA may be an area displaying an image. For example, the display area DA may be a central area of the display panel 100. The display area DA may include a plurality of pixels SP, a plurality of gate lines GL, a plurality of data lines DL, and a plurality of power source lines VL. Each of the plurality of pixels SP may be defined as a minimum unit that outputs light.

The plurality of gate lines GL may supply a gate signal (received from the gate driver 210) to the plurality of pixels SP. The plurality of gate lines GL may extend in the X-axis direction and may be spaced apart from each other in the Y-axis direction crossing the X-axis direction.

The plurality of data lines DL may supply a data voltage (received from the display driver 200) to the plurality of pixels SP. The plurality of data lines DL may extend in the Y-axis direction and may be spaced apart from each other in the X-axis direction.

The plurality of power source lines VL may supply a power source voltage (received from the display driver 200) to the plurality of pixels SP. Here, the power source voltage may be at least one of a driving voltage, an initialization voltage, or a reference voltage. The plurality of power source lines VL may extend in the Y-axis direction and may be spaced apart from each other in the X-axis direction, but the present invention is not limited thereto.

The non-display area NDA may partially or completely surround the display area DA. The non-display area NDA may include the gate driver 210, fan out lines FOL, and gate control lines GCL. The gate driver 210 may generate a plurality of gate signals based on the gate control signal and may sequentially supply the plurality of gate signals to the plurality of gate lines GL according to a set order.

The fan out lines FOL may extend from the display driver 200 to the display area DA at corresponding angles. The fan out lines FOL may supply the data voltage received from the display driver 200 to the plurality of data lines DL.

A gate control line GCL may extend from the display driver 200 to the gate driver 210. The gate control line GCL may supply the gate control signal received from the display driver 200 to the gate driver 210.

The sub area SBA may include the display driver 200, a display pad area DPA, and first and second touch pad areas TPA1 and TPA2. The display driver 200 may output signals and voltages for driving the display panel 100 to the fan out lines FOL. The display driver 200 may supply data voltages to the data lines DL through corresponding ones of the fan out lines FOL. The data voltages may be supplied to the plurality of pixels SP and may determine luminances of light emitted by the plurality of pixels SP. The display driver 200 may supply the gate control signals to the gate driver 210 through the gate control lines GCL.

The display pad area DPA, the first touch pad area TPA1, and the second touch pad area TPA2 may be disposed at edges of the sub area SBA. The display pad area DPA, the first touch pad area TPA1, and the second touch pad area TPA2 may be electrically connected to the circuit board 300 (e.g., refer to FIG. 2) by a low-resistance and high-reliability material such as an anisotropic conductive film or SAP (Self Assembly Anisotropic Conductive Paste).

The display pad area DPA may include a plurality of display pad units DP. The plurality of display pad units DP may be connected to a graphic system through the circuit board 300 (e.g., refer to FIG. 2). The plurality of display pad units DP may be connected to the circuit board 300 to receive digital video data and supply the digital video data to the display driver 200.

Figure 4:
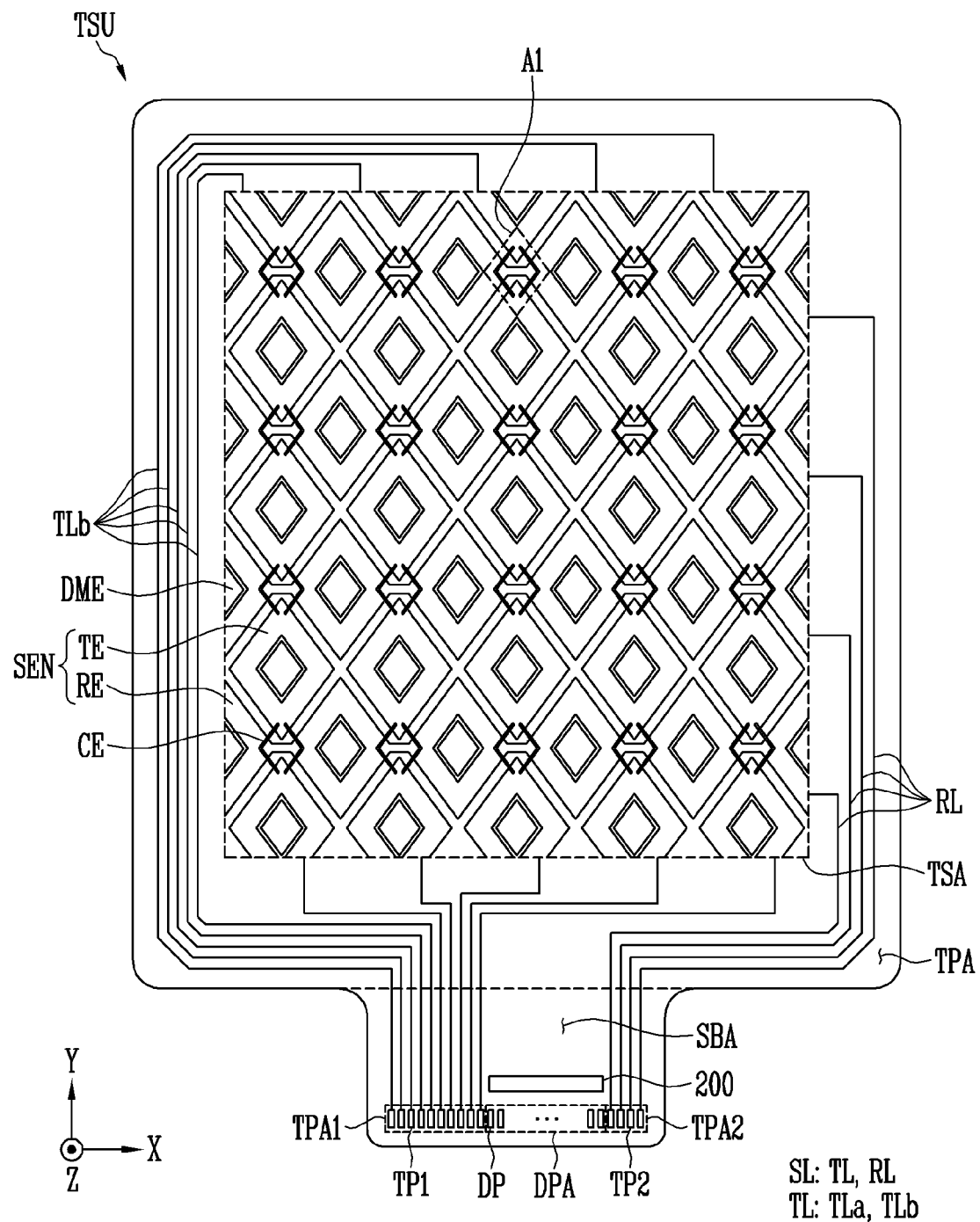
FIG. 4 is a plan view illustrating a touch sensing unit of the display device according to an embodiment.

FIG. 4 is a plan view illustrating a touch sensing unit TSU of the display device according to an embodiment.

Referring to FIG. 4, the touch sensing unit TSU may include a touch sensor area TSA that senses a user's touch and a touch peripheral area TPA disposed partially or entirely around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN (or sensing electrodes) and a plurality of dummy electrodes DME. The plurality of touch electrodes SEN may form mutual capacitance or self-capacitance in order to sense a touch of an object or a person.

The plurality of touch electrodes SEN may include a plurality of driving electrodes TE and a plurality of sensing electrodes RE. The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through a bridge electrode CE.

The plurality of driving electrodes TE may be connected to a first touch pad unit TP1 through a driving line TL. The driving line TL may include a lower driving line TLa and an upper driving line TLb. For example, the driving electrodes TE disposed below the touch sensor area TSA may be connected to the first touch pad unit TP1 through a lower driving line TLa. The driving electrodes TE disposed above the touch sensor area TSA may be connected to the first touch pad unit TP1 through an upper driving line TLb. The lower driving line TLa may pass through a lower side of the touch peripheral area TPA and extend to the first touch pad unit TP1. The upper driving line TLb may extend to the first touch pad unit TP1 via upper, left, and lower sides of the touch peripheral area TPA. The first touch pad unit TP1 may be connected to the touch driver 400 through the circuit board 300.

The bridge electrode CE may be bent at least once. For example, the bridge electrode CE may have an angle bracket shape ("<" or ">"), but the planar shape of the bridge electrode CE is not limited thereto. The driving electrodes TE adjacent to each other in the Y-axis direction may be connected to each other by a plurality of bridge electrodes CE. Even if one of the bridge electrodes CE is disconnected, the driving electrodes TE may be stably connected to each other through the remaining bridge electrodes CE. The driving electrodes TE adjacent to each other may be connected to each other by two bridge electrodes CE, but the number of bridge electrodes CE is not limited thereto.

The bridge electrode CE may be disposed on a different layer from the plurality of driving electrodes TE and the plurality of sensing electrodes RE. The sensing electrodes RE, that are adjacent to each other in the X-axis direction, may be electrically connected to each other through a connection part disposed on the same layer as the plurality of driving electrodes TE or the plurality of sensing electrodes RE. The driving electrodes TE, that are adjacent to each other in the Y-axis direction, may be electrically connected to each other through the bridge electrode CE disposed on a different layer from the plurality of driving electrodes TE or the plurality of sensing electrodes RE. Therefore, even if the bridge electrode CE overlaps the plurality of sensing electrodes RE in the Z-axis direction, the plurality of driving electrodes TE and the plurality of sensing electrodes RE may be insulated from each other. Mutual capacitance may be formed between a driving electrode TE and a sensing electrode RE.

The plurality of sensing electrodes RE may extend in the X-axis direction and may be spaced apart from each other in the Y-axis direction. The plurality of sensing electrodes RE may be arranged in the X-axis direction and the Y-axis direction. The sensing electrodes RE, that are adjacent to each other in the X-axis direction, may be electrically connected to each other through the connection part.

The plurality of sensing electrodes RE may be connected to the second touch pad unit TP2 through a sensing line RL. For example, the sensing electrodes RE disposed on the right side of the touch sensor area TSA may be connected to the second touch pad unit TP2 through the sensing line RL. The sensing line RL may extend to the second touch pad unit TP2 via right and lower sides of the touch peripheral area TPA. The second touch pad unit TP2 may be connected to the touch driver 400 through the circuit board 300.

Each of the plurality of dummy electrodes DME may be surrounded by the driving electrode TE or the sensing electrode RE. Each of the plurality of dummy electrodes DME may be spaced apart from and insulated from the driving electrode TE or the sensing electrode RE. Accordingly, the dummy electrodes DME may be electrically floated.

The display pad area DPA, the first touch pad area TPA1, and the second touch pad area TPA2 may be disposed at edges of the sub area SBA. The display pad area DPA, the first touch pad area TPA1, and the second touch pad area TPA2 may be electrically connected to the circuit board 300 by a low-resistance and high-reliability material such as, but not limited to, an anisotropic conductive film or SAP.

The first touch pad area TPA1 may be disposed on one side of the display pad area DPA and may include a plurality of first touch pad units TP1. The plurality of first touch pad units TP1 may be electrically connected to the touch driver 400 disposed on the circuit board 300. The plurality of first touch pad units TP1 may supply the touch driving signal to the plurality of driving electrodes TE through a plurality of driving lines TL.

The second touch pad area TPA2 may be disposed on the other (or opposing) side of the display pad area DPA and may include a plurality of second touch pad units TP2. The plurality of second touch pad units TP2 may be electrically connected to the touch driver 400 disposed on the circuit board 300. The touch driver 400 may receive a touch sensing signal through a plurality of sensing lines RL connected to the plurality of second touch pad units TP2, and may sense a change in mutual capacitance between the driving electrode TE and the sensing electrode RE.

In another example, the touch driver 400 may supply the touch driving signal to each of the plurality of driving electrodes TE and the plurality of sensing electrodes RE, and may receive the touch sensing signal from each of the plurality of driving electrodes TE and the plurality of sensing electrodes RE. The touch driver 400 may sense a change in the amount of charges in each of the plurality of driving electrodes TE and the plurality of sensing electrodes RE based on the touch sensing signal.

Figure 5:
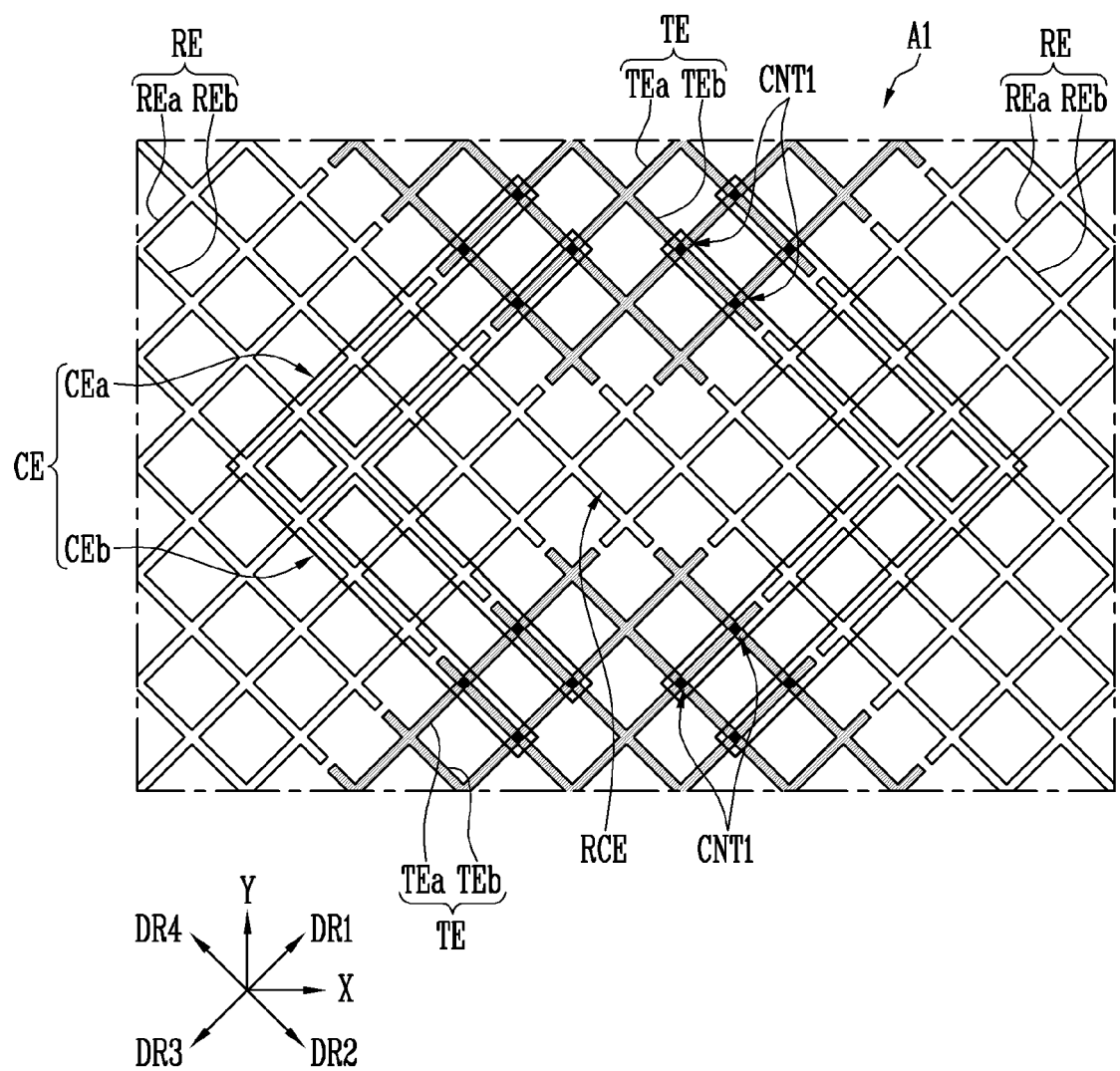
FIG. 5 is an enlarged plan view of an area A1 of the touch sensing unit of FIG. 4 according to an embodiment.
Figure 6:
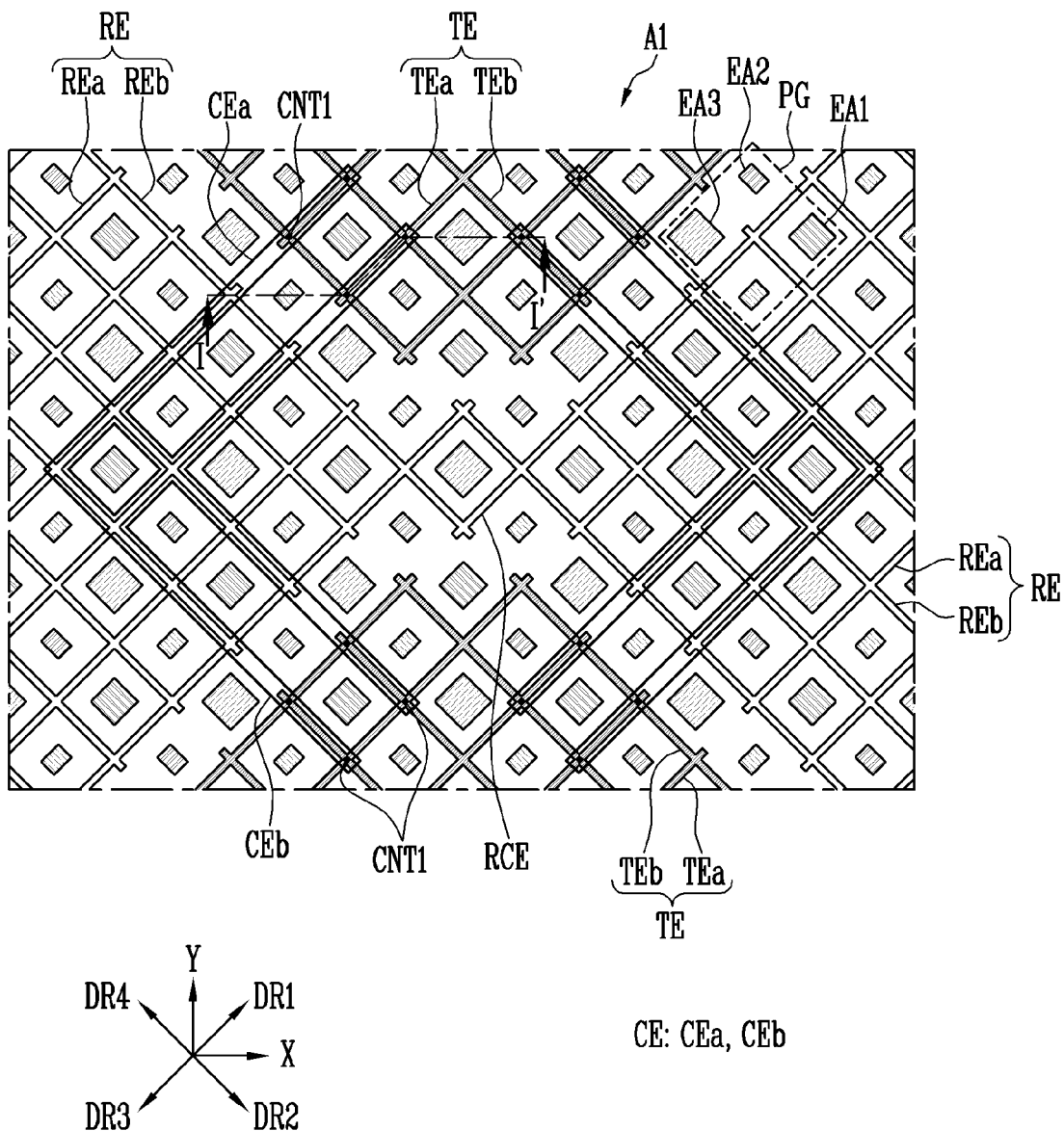
FIG. 6 is an enlarged plan view of a part of the display device according to an embodiment.

FIG. 5 is an enlarged plan view of an area A1 of the touch sensing unit of FIG. 4 according to an embodiment. FIG. 6 is an enlarged plan view of a part of the display device according to an embodiment. Compared to FIG. 5, FIG. 6 further shows emission areas EA1 to EA3.

Referring to FIGS. 5 and 6, the plurality of driving electrodes TE and the plurality of sensing electrodes RE (and the plurality of dummy electrodes DME of FIG. 4) may be disposed on the same layer and may be spaced apart from each other according to a predetermined pattern.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent to each other in the Y-axis direction may be electrically connected to each other through at least one of the bridge electrodes CE.

The plurality of sensing electrodes RE may extend in the X-axis direction and may be spaced apart from each other in the Y-axis direction. The plurality of sensing electrodes RE may be arranged in the X-axis direction and the Y-axis direction. The sensing electrodes RE, that are adjacent to each other in the X-axis direction, may be electrically connected to each other through the connection part RCE. For example, the connection part RCE of the sensing electrodes RE may be disposed within the shortest distance between the driving electrodes TE adjacent to each other.

The plurality of bridge electrodes CE may be disposed on a different layer from the driving electrode TE and the sensing electrode RE. The bridge electrode CE may include a first portion CEa and a second portion CEb. For example, the first portion CEa of the bridge electrode CE may be connected to the driving electrode TE disposed on one side through a first contact hole CNT1 and may extend in a third direction DR3. The second portion CEb of the bridge electrode CE may be bent (or disposed at an angle) from the first portion CEa in an area overlapping the sensing electrode RE, may extend in a second direction DR2, and may be connected to the driving electrode TE disposed on the other side through a first contact hole CNT1. Hereinafter, a first direction DR1 may be a direction between the X-axis direction and the Y-axis direction, the second direction DR2 may be a direction between an opposite direction of the Y-axis and the X-axis direction, the third direction DR3 may be a direction opposite to the first direction DR1, and a fourth direction DR4 may be a direction opposite to the second direction DR2. Accordingly, each of the plurality of bridge electrodes CE may connect adjacent ones of the driving electrodes TE, that are adjacent to each other in the Y-axis direction.

For example, the plurality of driving electrodes TE and the plurality of sensing electrodes RE (and the plurality of dummy electrodes DME of FIG. 4) may be formed in a mesh structure when viewed on a plane. The plurality of driving electrodes TE and the plurality of sensing electrodes RE may surround each of first to third emission areas EA1, EA2, and EA3 of a pixel group PG when viewed on a plane. Accordingly, the plurality of driving electrodes TE and the plurality of sensing electrodes RE may not overlap the first to third emission areas EA1, EA2, and EA3. Also, the plurality of bridge electrodes CE may not overlap the first to third emission areas EA1, EA2, and EA3. Accordingly, the display device 10 may prevent luminance of light emitted from the first to third emission areas EA1, EA2, and EA3 from being reduced by the touch sensing unit TSU.

Each of the plurality of driving electrodes TE may include a first portion TEa extending in the first direction DR1 and a second portion TEb extending in the second direction DR2. Each of the plurality of sensing electrodes RE may include a first portion REa extending in the first direction DR1 and a second portion REb extending in the second direction DR2.

Each of the plurality of pixels may include first to third sub-pixels, and each of the first to third sub-pixels may include the first to third emission areas EA1, EA2, and EA3. For example, the first emission area EA1 may emit light of a first color (e.g., red light), the second emission area EA2 may emit light of a second color (e.g., green light), and a third emission area EA3 may emit light of a third color (e.g., blue light), but may emit light of a different combination of colors in another embodiment.

In one embodiment, one pixel group PG may include one first emission area EA1, two second emission areas EA2, and one third emission area EA3 to express a white grayscale, but the configuration of the pixel group PG is not limited thereto. For example, a white grayscale may be expressed by a combination of light emitted from one first emission area EA1, light emitted from two second emission areas EA2, and light emitted from one third emission area EA3. As will be discussed in greater detail below, the light blocking members (or areas) may be arranged in a predetermined manner relative to the emission areas EA1, EA2, and EA3.

Figure 7:
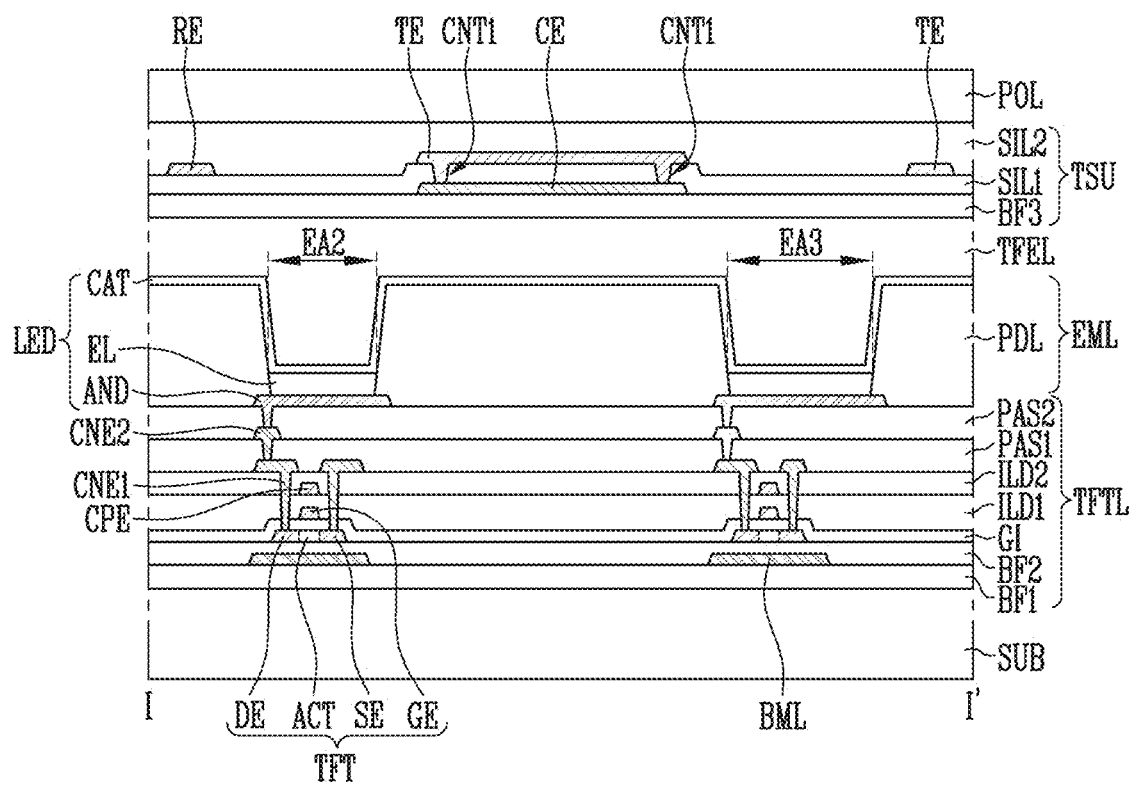
FIG. 7 is a cross-sectional view illustrating an embodiment of the display device taken along line I-I' of FIG. 6.

FIG. 7 is a cross-sectional view illustrating an embodiment of the display device taken along line I-I' of FIG. 6 according to an embodiment. Referring to FIG. 7, the display panel 100 may include the display unit DU, the touch sensing unit TSU, and the polarizing film POL.

The display unit DU may include the substrate SUB, the transistor layer TFTL, the light emitting element layer EML, and the encapsulation layer TFEL. The substrate SUB may be a base substrate or a base member.

The transistor layer TFTL may include a first buffer layer BF1, a light blocking layer BML, a second buffer layer BF2, a transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers alternately stacked.

The light blocking layer BML may be disposed on the first buffer layer BF1. For example, the light blocking layer BML may be formed of a single layer or multiple layers made of any one of molybdenum (Mo), aluminum (Al), chromium (Cr), gold (Au), titanium (Ti), nickel (Ni), neodymium (Nd), or copper (Cu) or an alloy thereof. In another example, the light blocking layer BML may be an organic layer including a black pigment.

The second buffer layer BF2 may cover the first buffer layer BF1 and the light blocking layer BML. The second buffer layer BF2 may include an inorganic layer capable of preventing penetration of air or moisture. For example, the second buffer layer BF2 may include a plurality of inorganic layers alternately stacked.

The transistor TFT (e.g., a thin film transistor) may be disposed on the second buffer layer BF2 and may be included in a pixel circuit provided for each of the plurality of pixels. For example, the transistor TFT may be a driving transistor or a switching transistor of the pixel circuit.

The transistor TFT may include a semiconductor region ACT, a source electrode SE, a drain electrode DE, and a gate electrode GE. The semiconductor region ACT, the source electrode SE, and the drain electrode DE may be disposed on the second buffer layer BF2. The semiconductor region ACT, the source electrode SE, and the drain electrode DE may overlap the light blocking layer BML in a thickness direction. The semiconductor region ACT may overlap the gate electrode GE in the thickness direction and may be insulated from the gate electrode GE by the gate insulating layer GI. The source electrode SE and the drain electrode DE may be provided by changing a material of the semiconductor region ACT to have conductivity.

The gate electrode GE may be disposed on the gate insulating layer GI. The gate electrode GE may overlap the semiconductor region ACT, with the gate insulating layer GI interposed therebetween.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE, and the second buffer layer BF2, and insulate the semiconductor region ACT and the gate electrode GE from each other. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may connect the drain electrode DE of the transistor TFT and the second connection electrode CNE2. The first connection electrode CNE1 may be inserted into contact holes provided in the second interlayer insulating layer ILD2, the first interlayer insulating layer ILD1, and the gate insulating layer GI to contact the drain electrode DE of the transistor TFT.

The first passivation layer PAS1 may cover the first connection electrode CNE1 and the second interlayer insulating layer ILD2. The first passivation layer PAS1 may protect the transistor TFT. The first passivation layer PAS1 may include a contact hole through which the second connection electrode CNE2 passes.

The second connection electrode CNE2 may be disposed on the first passivation layer PAS1. The second connection electrode CNE2 may connect the first connection electrode CNE1 and a pixel electrode AND of a light emitting element LED. The second connection electrode CNE2 may be inserted into the contact hole provided in the first passivation layer PAS1 to contact the first connection electrode CNE1.

The second passivation layer PAS2 may cover the second connection electrode CNE2 and the first passivation layer PAS1. The second passivation layer PAS2 may include a contact hole through which the pixel electrode AND of the light emitting element LED passes.

The light emitting element layer EML may be disposed on the transistor layer TFTL. The light emitting element layer EML may include the light emitting element LED and a pixel defining layer PDL. The light emitting element LED may include the pixel electrode AND, a light emitting layer EL, and a common electrode CAT.

The pixel electrode AND may be disposed on the second passivation layer PAS2. The pixel electrode AND may be disposed to overlap one of the first to third emission areas EA1, EA2, and EA3 defined by the pixel defining layer PDL. The pixel electrode AND may be connected to the drain electrode DE of the transistor TFT through the first and second connection electrodes CNE1 and CNE2.

The light emitting layer EL may be disposed on the pixel electrode AND. For example, the light emitting layer EL may be an organic light emitting layer made of an organic material, but the present invention is not limited thereto. When the light emitting layer EL is formed of an organic light emitting layer, the transistor TFT may apply a predetermined voltage to the pixel electrode AND of the light emitting element LED. When the common electrode CAT of the light emitting element LED receives a common voltage or a cathode voltage, holes and electrons may move to the light emitting layer EL through the hole transport layer and the electron transport layer, respectively, and may be combined with each other in the light emitting layer EL to emit light.

The common electrode CAT may be disposed on the light emitting layer EL. For example, the common electrode CAT may be implemented as a common electrode for all pixels without being separated provided for each pixel. The common electrode CAT may be disposed on the light emitting layer EL in the first to third emission areas EA1, EA2, and EA3, and disposed on the pixel defining layer PDL in areas other than the first to third emission areas EA1, EA2, and EA3.

The common electrode CAT may receive a common voltage, which, for example, may be a predetermined low potential voltage. When the pixel electrode AND receives a voltage corresponding to the data voltage and the common electrode CAT receives the low potential voltage, a potential difference may be formed between the pixel electrode AND and the common electrode CAT. This difference in potential causes the light emitting layer EL to emit light.

The pixel defining layer PDL may define the first to third emission areas EA1, EA2, and EA3. The pixel defining layer PDL may separate and insulate the pixel electrode AND of each of the plurality of light emitting elements LED.

The encapsulation layer TFEL may be disposed on the common electrode CAT to cover the plurality of light emitting elements LED. The encapsulation layer TFEL may include at least one inorganic layer and may prevent oxygen or moisture from permeating into the light emitting element layer EML. The encapsulation layer TFEL may include at least one organic layer and may protect the light emitting element layer EML from foreign substances such as dust.

The touch sensing unit TSU may be disposed on the encapsulation layer TFEL. The touch sensing unit TSU may include a third buffer layer BF3, the bridge electrode CE, a first insulating layer SIL1, the driving electrode TE, the sensing electrode RE, and a second insulating layer SIL2. The third buffer layer BF3 may be disposed on the encapsulation layer TFEL. The third buffer layer BF3 may have insulating and optical properties. The third buffer layer BF3 may include at least one inorganic layer. In one embodiment, the third buffer layer BF3 may be omitted.

The bridge electrode CE may be disposed on the third buffer layer BF3. The bridge electrode CE may be disposed on a different layer from the driving electrode TE and the sensing electrode RE, and may connect the driving electrodes TE adjacent to each other in the Y-axis direction.

The first insulating layer SIL1 may at least partially cover the bridge electrode CE and the third buffer layer BF3. The first insulating layer SIL1 may have insulating and optical properties. For example, the first insulating layer SIL1 may be an inorganic layer including at least one of a silicon nitride layer, a silicon oxy nitride layer, a silicon oxide layer, a titanium oxide layer, or an aluminum oxide layer.

The driving electrode TE and the sensing electrode RE may be disposed on the first insulating layer SIL1. Each of the driving electrode TE and the sensing electrode RE may not overlap the first to third emission areas EA1, EA2, and EA3. Each of the driving electrode TE and the sensing electrode RE may be formed of a single layer which, for example, may be made of molybdenum (Mo), titanium (Ti), copper (Cu), aluminum (Al), or indium tin oxide (ITO). In one embodiment, each of the driving electrode TE and the sensing electrode RE may be formed of a laminated structure of aluminum and titanium (Ti/Al/Ti), a laminated structure of aluminum and ITO (ITO/Al/ITO), an APC alloy, or a laminated structure of an APC alloy and ITO (ITO/APC/ITO).

The second insulating layer SIL2 may cover the driving electrode TE, the sensing electrode RE, and the first insulating layer SIL1. The second insulating layer SIL2 may have insulating and optical properties. The second insulating layer SIL2 may be formed of a material which, for example, may be the same as the material of the first insulating layer SIL1.

The polarizing film POL may be disposed on the touch sensing unit TSU.

Figure 8:
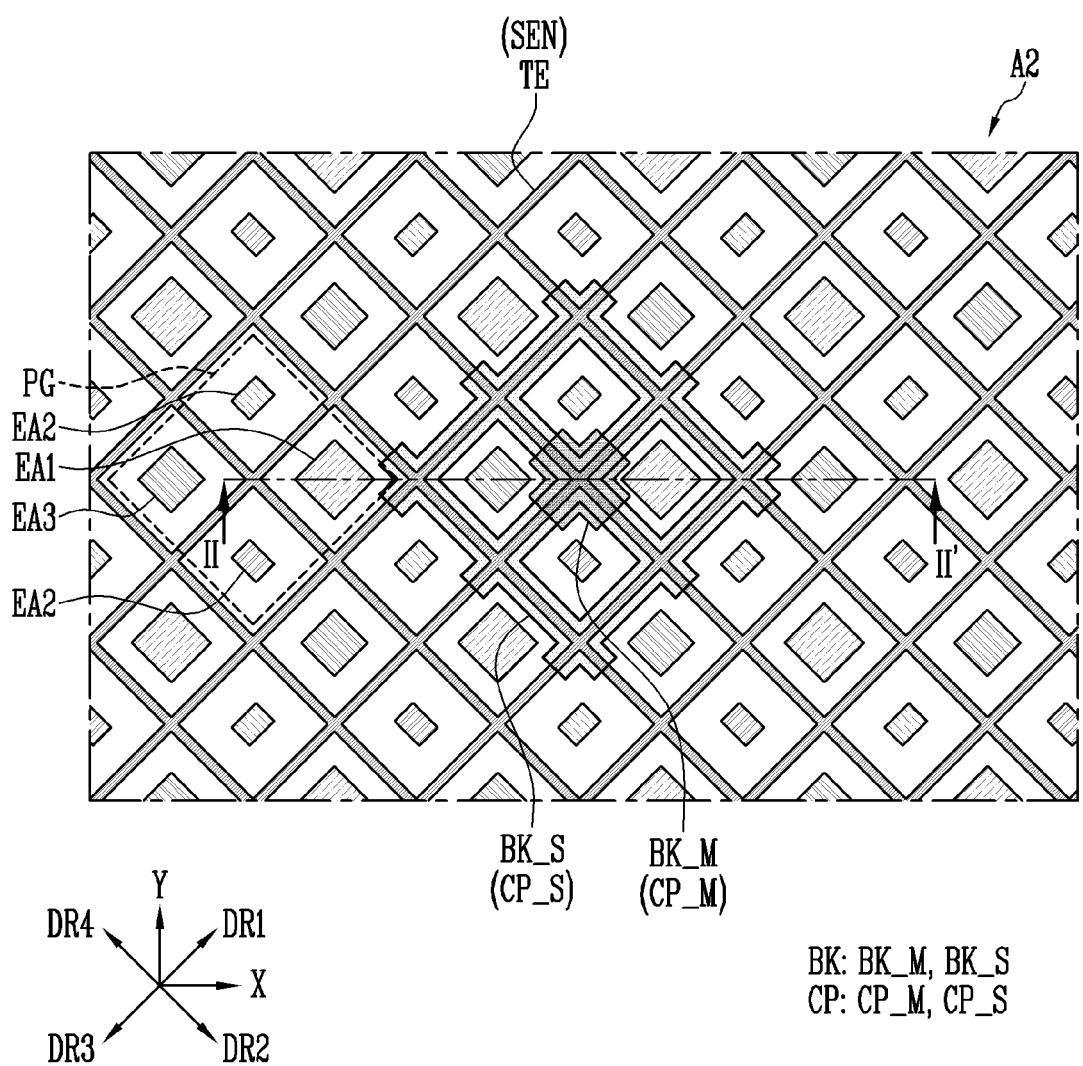
FIG. 8 is a plan view illustrating an embodiment of the display device in which an area A2 of FIG. 4 is enlarged.
Figure 9:
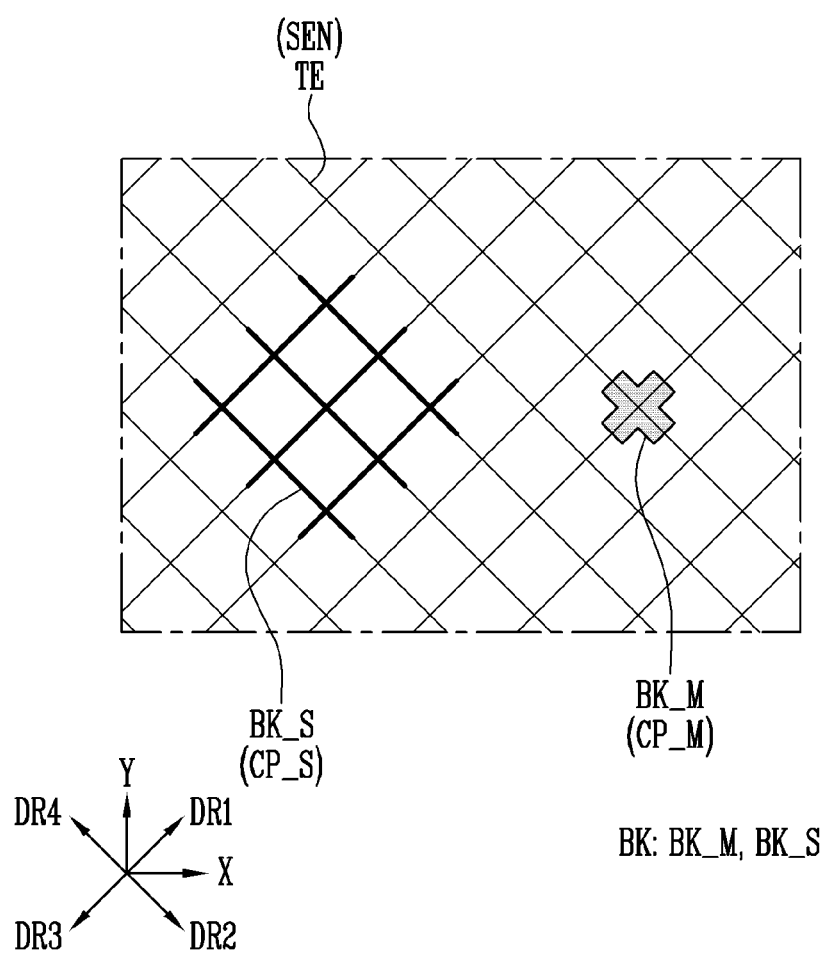
FIG. 9 is a plan view for explaining a light blocking member according to an embodiment.
Figure 10:
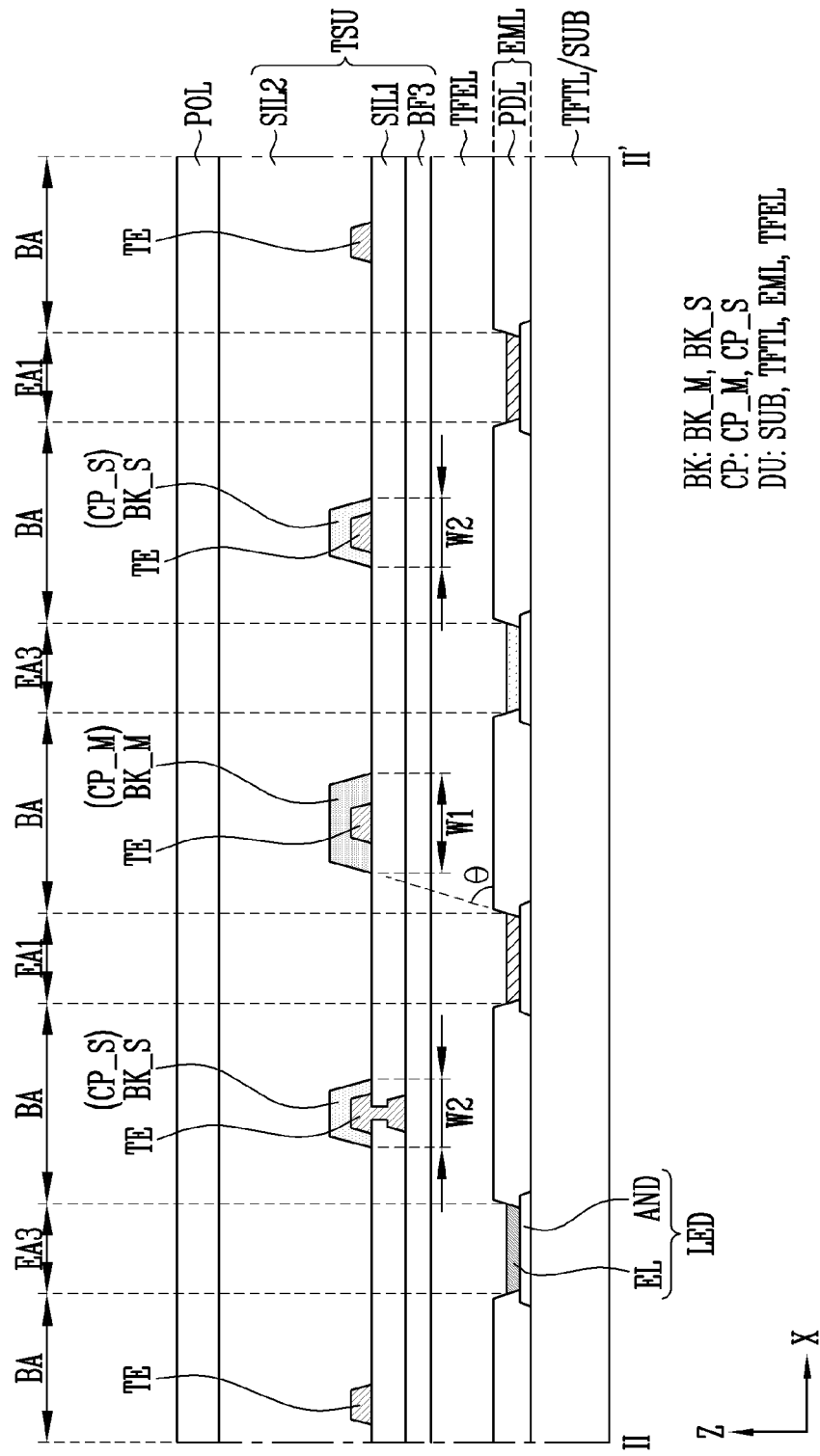
FIG. 10 is a cross-sectional view illustrating an embodiment of the display device taken along line II-II' of FIG. 8.

FIG. 8 is a plan view illustrating an embodiment of the display device in which an area A2 of FIG. 4 is enlarged. FIG. 9 is a plan view for explaining a light blocking member according to an embodiment. For convenience of description, FIG. 9 shows only the driving electrode TE (or touch electrode SEN) and a light blocking member BK. FIG. 10 is a cross-sectional view illustrating an embodiment of the display device taken along line II-II' of FIG. 8. For convenience of description, FIG. 10 briefly shows the light emitting element layer EML and the transistor layer TFTL (and the substrate SUB), but the display device of FIG. 10 may include the light emitting element layer EML and the transistor layer TFTL described with reference to FIG. 8.

Referring to FIGS. 5 to 10, the area A2 of FIG. 8 may further include the light blocking member BK (or code pattern CP), and a configuration similar to the configuration described above will be briefly described or omitted. In accordance with one or more embodiments, the light blocking member BK may be referred to as a light blocking area.

Referring to FIGS. 8 to 10, the touch sensing unit TSU may further include the light blocking member BK covering some of the plurality of touch electrodes SEN. As will be described in greater detail below, the light blocking member BK may be a position code (or code) having location information determined by the shape, arrangement, and the like of the light blocking member BK (refer to FIG. 14). The position code may be arranged in a specific direction at the intersection of one or more virtual (e.g., reference) lines arranged at a predetermined periodicity (e.g., refer to FIG. 14). The value of the position code may be determined by the position of the light blocking member relative to one or more of the virtual lines. The virtual lines may correspond to rows and columns. For example, the rows and columns may be defined by (e.g., overlap rows and columns of) pixels in the display panel or may be predetermined reference lines that correspond to rows and columns of the light blocking members BK. Hereinafter, in describing the location information or the position code, the light blocking member BK will be referred to as a code pattern CP.

The light blocking member BK may cover upper and side surfaces of the touch electrode SEN. The light blocking member BK may cover a portion of the driving electrode TE or a portion of the sensing electrode RE. As shown in FIG. 10, the light blocking member BK may be directly disposed on the driving electrode TE (or touch electrode SEN) and may contact the driving electrode TE.

As shown in FIG. 8, the light blocking member BK may surround at least one of the first to third emission areas EA1, EA2, and EA3 when viewed on a plane. In this case, the light blocking member BK may have a mesh structure when viewed on a plane.

The light blocking member BK may be disposed in the non-emission area BA between the first to third emission areas EA1, EA2, and EA3 when viewed on a plane (or cross-section) and may not overlap the first to third emission areas EA1, EA2, and EA3, as shown, for example, in FIG. 10. Accordingly, the display device 10 may prevent luminance of light emitted from the first to third emission areas EA1, EA2, and EA3 from being reduced by the light blocking member BK.

In an embodiment, the light blocking member BK may have a closed-loop shape. In this case, compared to an open-loop shape or the line shape, identification sensitivity of the light blocking member BK (or code pattern CP) can be improved.

The light blocking member BK may absorb light of a specific wavelength, and the touch electrode SEN may reflect light of a specific wavelength. For example, the light blocking member BK may include an infrared ray absorbing material or an ultraviolet ray absorbing material, and the plurality of touch electrodes SEN may include an infrared ray reflective material or an ultraviolet ray reflective material. For example, the light blocking member BK may include an inorganic black pigment or an organic black pigment. The inorganic black pigment may be carbon black, and the organic black pigment may include at least one of lactam black, perylene black, or aniline black, but the present invention is not limited thereto. Therefore, when the camera captures the touch sensing unit TSU using an infrared ray or an ultraviolet ray, the light blocking member BK covering a portion of the touch electrode SEN can be distinguished from the other portion of the touch electrode SEN not covered by the light blocking member BK. Since the camera (or an input device including the same) uses an infrared ray or an ultraviolet ray to identify the light blocking member BK (or code pattern CP), image quality of the display device 10 may not deteriorate when identifying the light blocking member BK (or code pattern CP).

The code pattern CP may be disposed over an entire area of the touch sensor area TSA of the touch sensing unit TSU. Each code pattern CP may have location information according to a specific criterion. The code pattern CP may be captured by a camera approaching the front of the display device 10, and may be identified through captured video or image. At least one code pattern CP (or a combination of code patterns CP) may correspond to a value of a predetermined data code. For example, the code pattern CP disposed at a specific location may correspond to a data code designated at a corresponding location. For example, at least one code pattern CP (or a combination of code patterns CP) may have location information according to a specific criterion and may correspond to a predetermined data code on a 1:1 basis.

The display device 10 may receive an input by an input device (such as an input pen) by including the light blocking member BK covering some of the plurality of touch electrodes SEN (or the code pattern CP having location information determined by the shape, arrangement, and the like of the light blocking member BK). Here, the input pen may decode input coordinates based on the image (for example, the code pattern CP) captured by a built-in camera. For example, the input pen may be a smart pen, an electromagnetic pen, or an active pen, but the present invention is not limited thereto.

The display device 10 may perform a corresponding function based on accurate input coordinates, by receiving coordinate data generated without having to perform a complicated calculation and correction using the data code. For example, cost and power consumption can be reduced and a driving process can be simplified by the display device 10. In addition, since the display device 10 includes the light blocking member BK covering a portion of the touch electrode SEN, the display device 10 may not be limited in size and may be applied to all electronic devices having a touch function.

In some embodiments, the code pattern CP may include a first code pattern CP_M (or main code pattern) and a second code pattern CP_S (or auxiliary code pattern). The light blocking member BK may include a first light blocking member BK_M (or a first part) corresponding to the first code pattern CP_M and a second light blocking member BK_S (or a second part) corresponding to the second code pattern CP_S. The first light blocking member BK_M (or first part) and the second light blocking member BK_S (or second part) may have different line widths in a width direction. As will be described later, when the input device touches or is adjacent to the display device 10, the input coordinates may be determined based on the first code pattern CP_M. When the input device is separated from the display device 10 (for example, hovering), the input coordinates may be determined based on a combined shape of the first code pattern CP_M and the second code pattern CP_S (that is, the code pattern CP).

Referring to FIGS. 8 and 9, the code pattern CP may be formed by overlapping the first code pattern CP_M and the second code pattern CP_S. The first code pattern CP_M may have first location information, and the second code pattern CP_S may have second location information. Although described later with reference to FIG. 14, in one embodiment the first location information and the second location information may be the same.

Also, in an embodiment, the first code pattern CP_M and the second code pattern CP_S (or the first light blocking member BK_M and the second light blocking member BK_S) may have different sizes (or different areas) and different line widths. For example, as shown in FIGS. 8 and 9, when viewed on a plane, the size of the first code pattern CP_M may be smaller than the size of the second code pattern CP_S. For example, as shown in FIG. 10, a line width W1 of the first code pattern CP_M may be larger than a line width W2 of the second code pattern CP_S.

The line width W1 of the first code pattern CP_M and the line width W2 of the second code pattern CP_S may be set within a range that does not cover the viewing angle of the light emitting element LED (or pixel). For example, when light is emitted from the light emitting element LED within a range up to a reference angle Θ with respect to the substrate SUB (see, e.g., FIG. 10), the line width W1 of the first code pattern CP_M may be set to a maximum value within a range in which the first code pattern CP_M does not block the light, and the line width W2 of the second code pattern CP_S may be set smaller than the line width W1 of the first code pattern CP_M.

In an embodiment, the first code pattern CP_M and the second code pattern CP_S may have different planar shapes. For example, the second code pattern CP_S may include a closed loop surrounding at least one of the first to third emission areas EA1, EA2, and EA3 when viewed on a plane, and according to one example may have a rhombic planar shape as a whole. The first code pattern CP_M may not include a closed loop and, for example, may have a dot or X shape as a whole. However, the present invention is not limited thereto, and the first code pattern CP_M and the second code pattern CP_S may have the same or similar planar shape (e.g., refer to FIG. 16).

Figure 11:
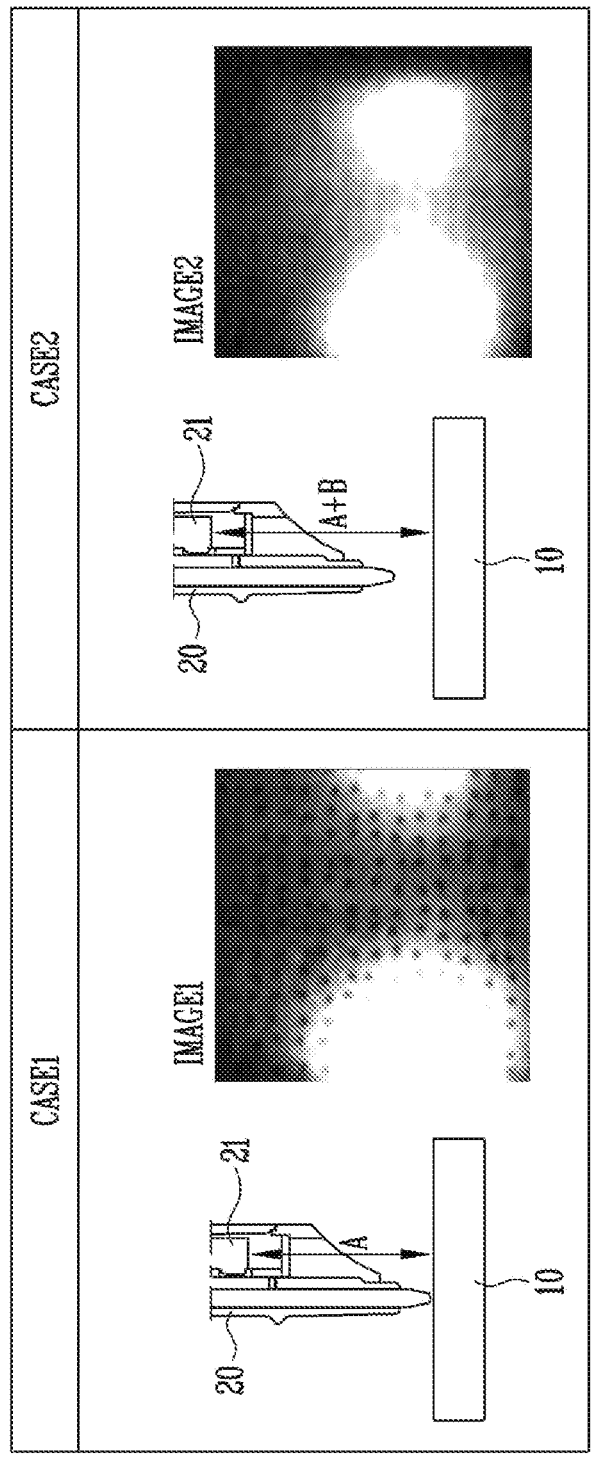
FIG. 11 is a diagram for explaining a code pattern of FIG. 8 according to an embodiment.
Figure 12:
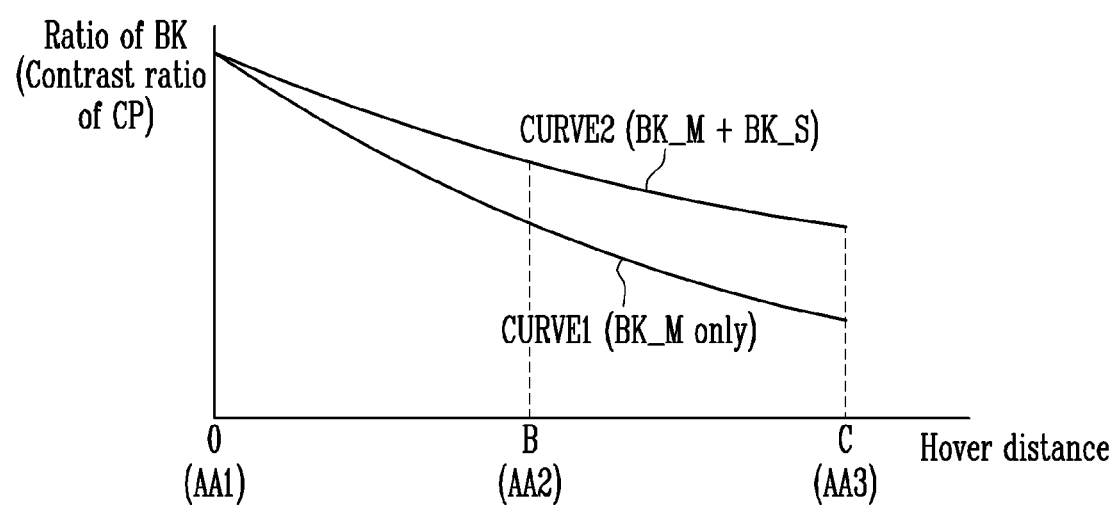
FIG. 12 is a diagram illustrating a contrast ratio of the code pattern according to a hover distance according to an embodiment.
Figure 13:
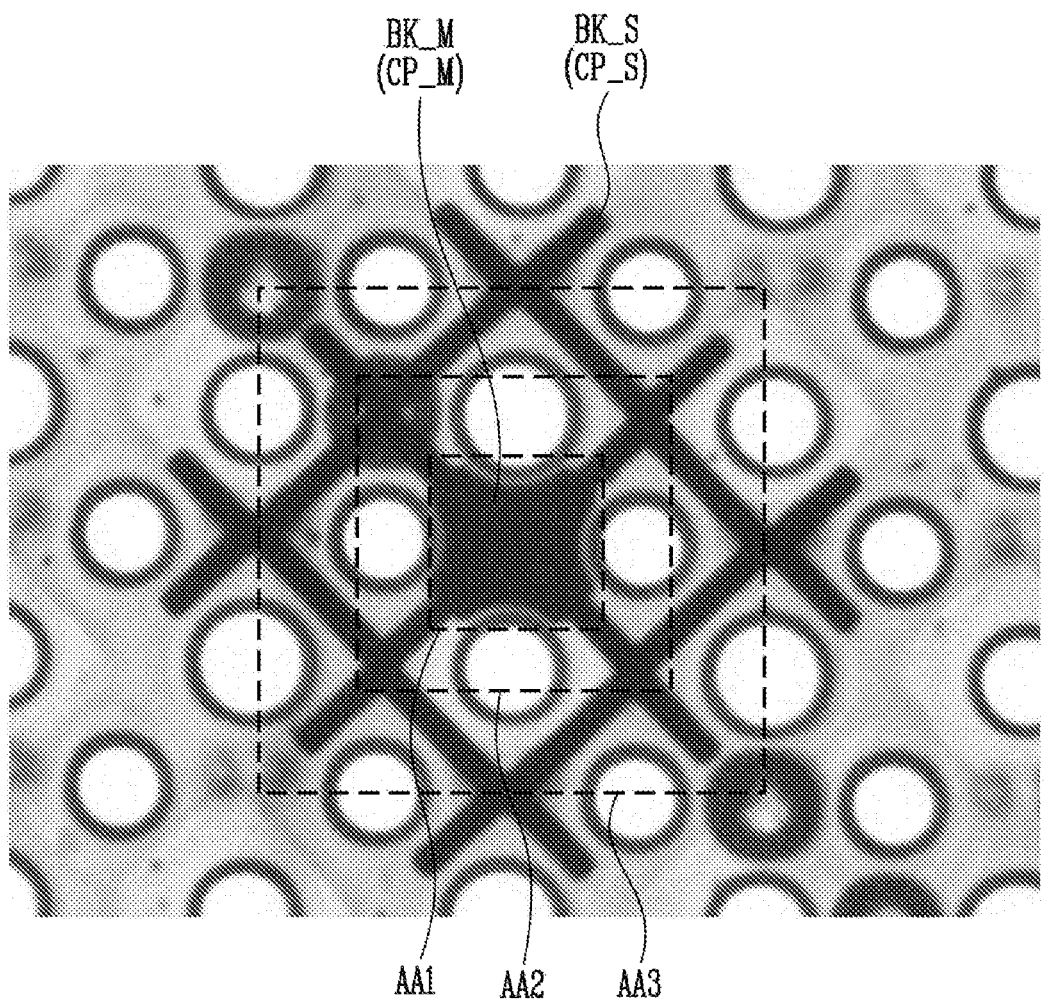
FIG. 13 is a plan view illustrating the code pattern according to an embodiment.

FIG. 11 is a diagram for explaining a code pattern of FIG. 8 according to an embodiment. FIG. 12 is a diagram illustrating a contrast ratio of the code pattern according to a hover distance. FIG. 13 is a plan view illustrating the code pattern. FIG. 13 may correspond to FIG. 8.

Referring to FIGS. 11 to 13, an input device 20 may include a camera 21 and may decode input coordinates based on an image of the display device 10 captured by the camera 21.

Depending on the distance (or hover distance) between the input device 10 and the display device 10, the focus depth may vary, and the number of code patterns and the contrast ratio in the captured image may vary. When the display device 10 includes only the first code pattern CP_M (or the first light blocking member BK_M) or the second code pattern CP_S (or the second light blocking member BK_S), there may be restrictions on expressing location.

Hereinafter, a first case CASE1 and a second case CASE2 will be sequentially described. First, in the first case CASE1, the input device 20 may be in contact with the display device 10 (that is, the hover distance is 0) and the camera 21 of the input device 20 and the display device 10 may be spaced apart by about A. For example, A may be about 23.6 mm. In this case, a first image IMAGE1 of the display device 10 may be obtained by the camera 21, and the code pattern (for example, a plurality of dots in the first image IMAGE1) may be recognized.

For example, referring to FIG. 13, in the first case CASE1, an image of a first area AA1 may be obtained by one sensor (for example, a sensor having a size of about 40 µm) in the camera 21. Substantially only the first light blocking member BK_M (or the first code pattern CP_M) may exist in the first area AA1.

Referring to FIG. 12, in a comparative example in which the display device 10 includes only the first light blocking member BK_M (that is, the first code pattern CP_M), the first curve CURVE1 may represent a ratio (or area ratio) of the light blocking member BK or a contrast ratio of the code pattern CP in the image obtained by one sensor in the camera 21. In an embodiment in which the display device 10 includes the first light blocking member BK_M (that is, the first code pattern CP_M) and the second light blocking member BK_S (that is, the second code pattern CP_S), the second curve CURVE2 may represent a ratio of the light blocking member BK or a contrast ratio of the code pattern CP in the image obtained by one sensor in the camera 21.

When the hover distance is 0, in the first curve CURVE1 and the second curve CURVE2, the ratio (or contrast ratio) of the light blocking member BK may be the same or relatively high. Accordingly, the code pattern CP can be accurately recognized regardless of the presence or absence of the second light blocking member BK_S (or the second code pattern CP_S).

Next, in the second case CASE2, the input device 20 may be spaced apart from the display device 10 by a distance B (that is, the hover distance is B). In this case, the camera 21 of the input device 20 and the display device 10 may be spaced apart by about "A+B". For example, B may be about 10 mm. In this case, a second image IMAGE2 of the display device 10 may be obtained by the camera 21, and in some cases, the code pattern may not be properly recognized.

For example, referring to FIG. 13, in the second case CASE2, an image of a second area AA2 may be obtained by one sensor in the camera 21. Components other than the first light blocking member BK_M (or the first code pattern CP_M) may further exist in the second area AA2.

When the hover distance is B, in the first curve CURVE1 and the second curve CURVE2 of FIG. 12, the ratio (or contrast ratio) of the light blocking member BK may be relatively low. For example, based on the case where the hover distance is 0, the ratio (or contrast ratio) of the light blocking member BK in the first curve CURVE1 may be reduced by about 20%, and the ratio (or contrast ratio) of the light blocking member BK in the second curve CURVE2 may be reduced by about 10%. Thus, the value of the second curve CURVE2 for an embodiment further including the second light blocking member BK_S (or the second code pattern CP_S) may be higher than a value of the first curve CURVE1 which does not include the second light blocking member BK_S (or the second code pattern CP_S). Accordingly, in a state where the hover distance is greater than 0, the code pattern CP further including the second code pattern CP_S can be more accurately recognized.

As another example, when the input device 20 is spaced apart from the display device 10 by C (that is, the hover distance is C), an image of a third area AA3 (refer to FIG. 13) may be obtained by one sensor in the camera 21. When the hover distance is C, in the first curve CURVE1 and the second curve CURVE2 of FIG. 12, the ratio (or contrast ratio) of the light blocking member BK may be lower. For example, based on the case where the hover distance is 0, the ratio (or contrast ratio) of the light blocking member BK in the first curve CURVE1 may be reduced by about 35%, and the ratio (or contrast ratio) of the light blocking member BK in the first curve CURVE1 may be reduced by about 20%. In this case, the code pattern including only the first code pattern CP_M may not be accurately recognized.

As described above, when the code pattern CP further includes the second code pattern CP_S in addition to the first code pattern CP_M, the code pattern CP can be more accurately recognized even in a hovering state of the input device 20.

Meanwhile, when the code pattern CP includes only the second code pattern CP_S without the first code pattern CP_M, the recognition rate of the code pattern CP may be relatively low because the ratio (or area ratio) of the light blocking member BK in the image or the contrast ratio of the code pattern CP is generally low.

In addition, when the size of the first code pattern CP_M is as large as the size of the second code pattern CP_S, the first code pattern CP_M may be recognized even in a hovering state of the input device 20. However, the first code pattern CP_M (that is, the first code pattern CP_M having a relatively large and thick line width) itself may be visually recognized by a user or may deteriorate light emitting characteristics of the display device 10. Also, even when the input device 20 contacts or is adjacent to the display device 10 at an angle rather than perpendicularly, the code pattern CP must be recognized. However, when the code pattern CP (particularly, the first code pattern CP_M) is large, the distance between the code pattern CP and other code patterns may not be secured.

That is, deterioration in light emitting characteristics (for example, viewing angle characteristics and white angular dependency) of the display device 10 can be reduced or minimized by reducing or minimizing the size of the first code pattern CP_M having a large line width. In addition, input performance (in particular, input performance in a hovering state) can be maintained or improved by additionally using the second code pattern CP_S having a relatively small line width.

Figure 14:
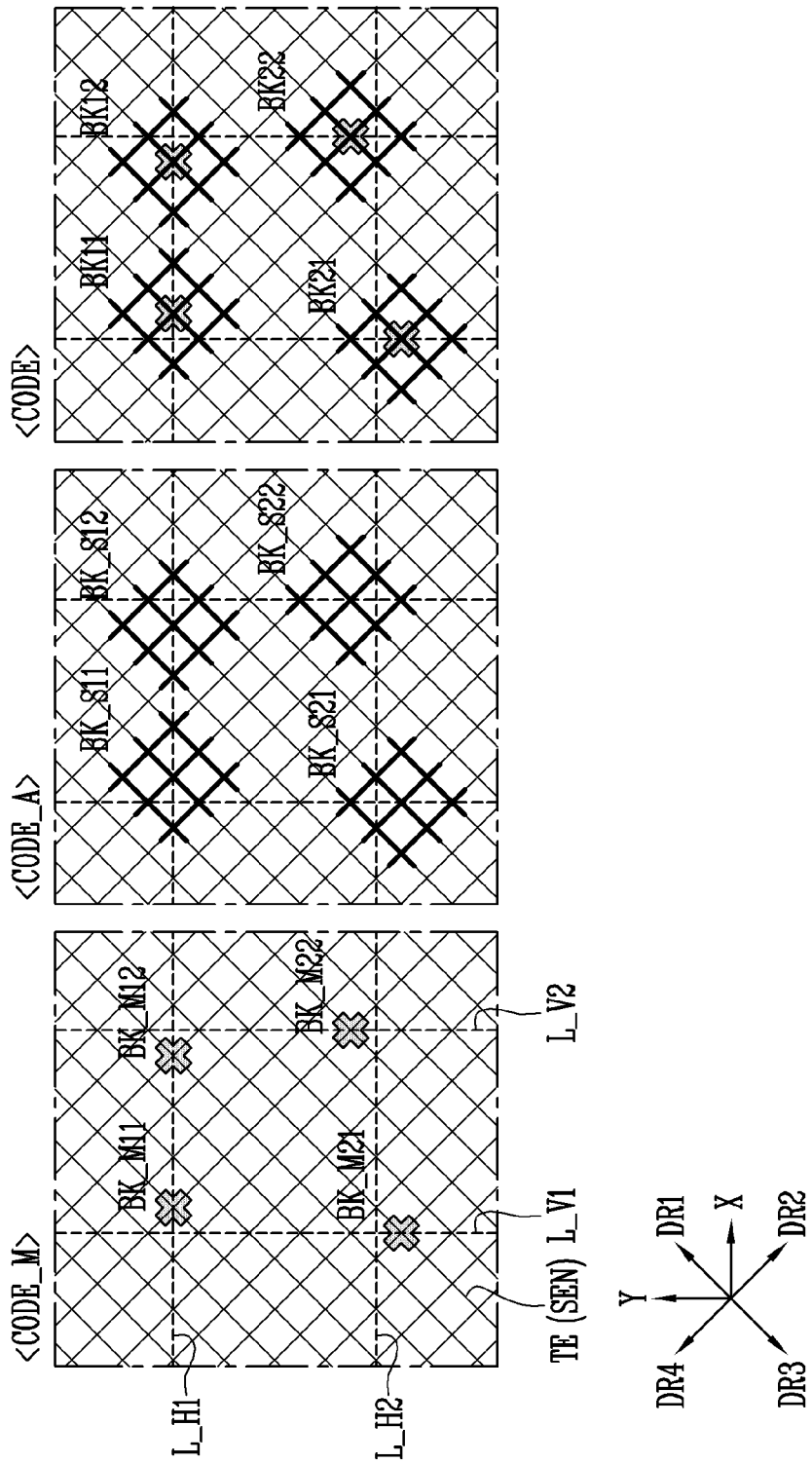
FIGS. 14 and 15 are plan views for explaining position codes according to an arrangement of light blocking members according to an embodiment.
Figure 15:
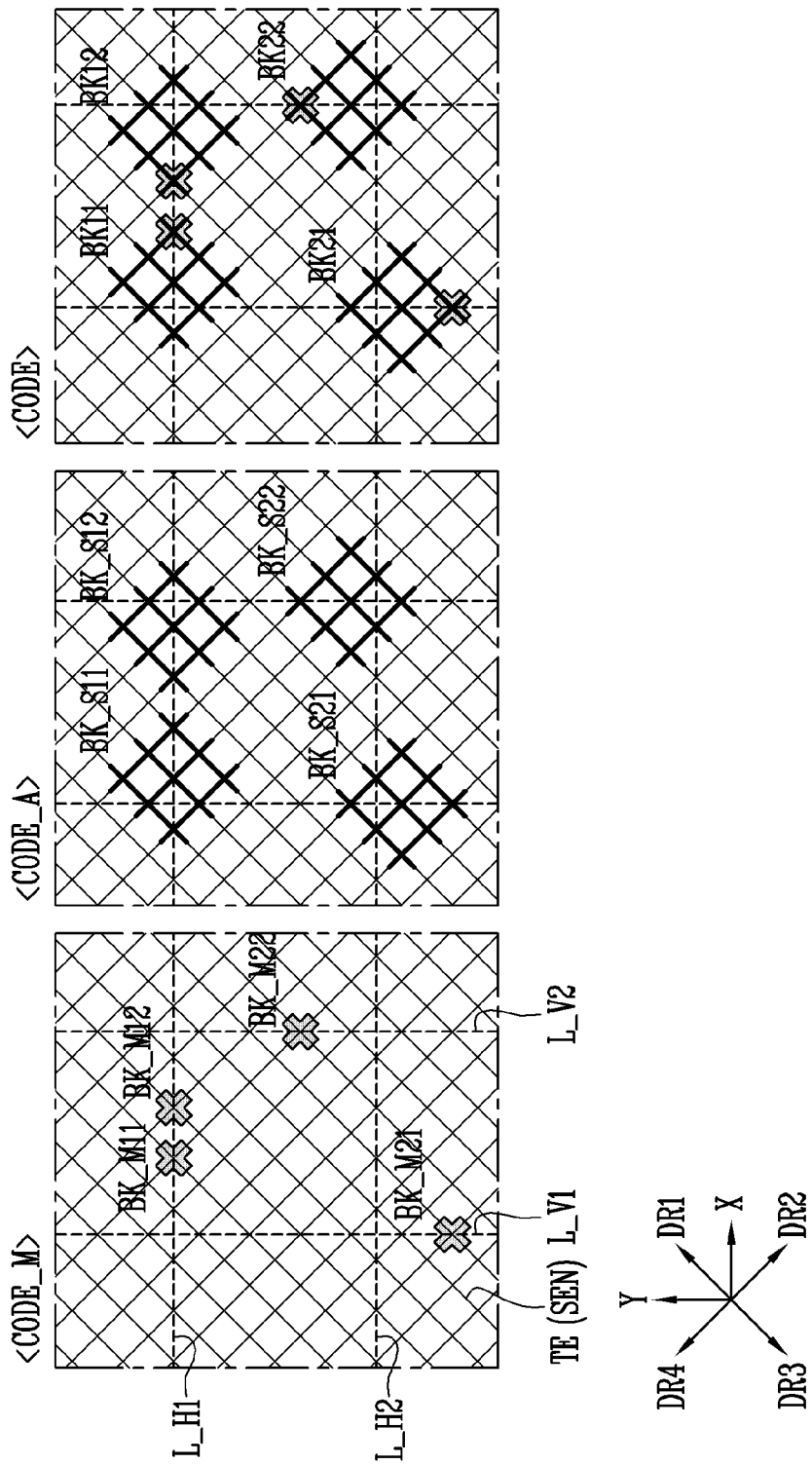

FIGS. 14 and 15 are plan views for explaining position codes according to an arrangement of light blocking members according to an embodiment. For convenience of description, FIG. 14 shows only the driving electrode TE (or touch electrode SEN) and the light blocking member BK described with reference to FIG. 8. A configuration similar to the configuration described above will be briefly described or omitted.

Referring to FIGS. 14 and 15, light blocking members BK11 to BK22 (or code patterns) may be substantially arranged in rows and columns when viewed on a plane. Location information may be determined by positions where the light blocking members BK11 to BK22 are disposed based on virtual (reference) lines L_H1, L_H2, L_V1, and L_V2 corresponding to the rows and columns.

A first position code CODE_M may be composed of main light blocking members BK_M11 to BK_M22 (or first light blocking members and main code patterns).

An eleventh main light blocking member BK_M11 may be adjacent to or aligned with at least one of a first horizontal line L_H1 and a first vertical line L_V1. In one embodiment, the eleventh main light blocking member BK_M11 may be positioned on the first horizontal line L_H1 and may be positioned on the right side of the first vertical line L_V1. In this case, the eleventh main light blocking member BK_M11 may have a value corresponding to "right".

A twelfth main light blocking member BK_M12 may be adjacent to or aligned with at least one of the first horizontal line L_H1 and a second vertical line L_V2. In one embodiment, the twelfth main light blocking member BK_M12 may be positioned on the first horizontal line L_H1 and may be positioned on the left side of the second vertical line L_V2. In this case, the twelfth main light blocking member BK_M12 may have a value corresponding to "left".

A twenty-first main light blocking member BK_M21 may be adjacent to or aligned with at least one of a second horizontal line L_H2 and the first vertical line L_V1. In one embodiment, the twenty-first main light blocking member BK_M21 may be positioned below the second horizontal line L_H2 and may be positioned on the first vertical line L_V1. In this case, the twenty-first main light blocking member BK_M21 may have a value corresponding to "down".

A twenty-second main light blocking member BK_M22 may be adjacent to or aligned with at least one of the second horizontal line L_H2 and the second vertical line L_V2. In one embodiment, the twenty-second main light blocking member BK_M22 may be positioned above the second horizontal line L_H2 and may be positioned on the first vertical line L_V1. In this case, the twenty-second main light blocking member BK_M22 may have a value corresponding to "up".

The first position code CODE_M (first location information or first data code) may be determined by a combination of the main light blocking members BK_M11 to BK_M22 (or values thereof). As is evident from the above description, none of the main light blocking members in the first position code CODE_M overlap an intersection of any of the vertical lines or the horizontal lines.

Similar to the first position code CODE_M, a second position code CODE_A may be composed of auxiliary light blocking members BK_S11 to BK_S22 (or second light blocking members and auxiliary code patterns). However, unlike CODE_M, the auxiliary light blocking members BK_S11 to BK_S22 overlap intersections of the vertical and horizontal lines. For example, an eleventh auxiliary light blocking member BK_S11 may be adjacent to or aligned with at least one of the first horizontal line L_H1 and the first vertical line L_V1. In one embodiment, the eleventh auxiliary light blocking member BK_S11 may be positioned on the first horizontal line L_H1 and most of the auxiliary light blocking member BK_S11 may be positioned on the right side of the first vertical line L_V1, e.g., a center point of the auxiliary light blocking member BK_S11 is positioned on the right side of vertical line L_V1. In this case, the eleventh auxiliary light blocking member BK_S11 may have a value corresponding to "right".

A twelfth auxiliary light blocking member BK_S12 may be adjacent to or aligned with at least one of the first horizontal line L_H1 and the second vertical line L_V2. In one embodiment, the twelfth auxiliary light blocking member BK_S12 may be positioned on the first horizontal line L_H1 and (at least a center point) may be positioned on the left side of the second vertical line L_V2. In this case, the twelfth auxiliary light blocking member BK_S12 may have a value corresponding to "left".

A twenty-first auxiliary light blocking member BK_S21 may be adjacent to the second horizontal line L_H2 and the first vertical line L_V1. The twenty-first auxiliary light blocking member BK_S21 (e.g., at least a center point thereof) may be positioned below the second horizontal line L_H2 and may be positioned on the first vertical line L_V1. In this case, the twenty-first auxiliary light blocking member BK_S21 may have a value corresponding to "down".

A twenty-second auxiliary light blocking member BK_S22 may be adjacent to the second horizontal line L_H2 and the second vertical line L_V2. The twenty-second auxiliary light blocking member BK_S22 (e.g., at least a center point thereof) may be positioned above the second horizontal line L_H2 and may be positioned on the first vertical line L_V1. In this case, the twenty-second auxiliary light blocking member BK_S22 may have a value corresponding to "up".

The second position code CODE_A (second location information or second data code) may be determined by a combination of the auxiliary light blocking members BK_S11 to BK_S22 (or values thereof). The second position code CODE_A may have the same value (or decoding value) as the first position code CODE_M.

The position code CODE may be composed of the light blocking members BK11 to BK22, which are based on a combination of CODE_M and CODE_A. For example, the eleventh light blocking member BK11 may include the eleventh main light blocking member BK_M11 and the eleventh auxiliary light blocking member BK_S11 at the same positions they appear in CODE_M and CODE_A, respectively. The twelfth light blocking member BK12 may include the twelfth main light blocking member BK_M12 and the twelfth auxiliary light blocking member BK_S12. The twenty-first light blocking member BK21 may include the twenty-first main light blocking member BK_M21 and the twenty-first auxiliary light blocking member BK_S21. The twenty-second light blocking member BK22 may include the twenty-second main light blocking member BK_M22 and the twenty-second auxiliary light blocking member BK_S22. Accordingly, the position code CODE may include the first position code CODE_M and the second position code CODE_A having the same value (or decoding value).

In an embodiment, the center of an area of the main light blocking member (the first light blocking member or the first code pattern) may be the same as the center of an area of the auxiliary light blocking member (the second light blocking member or the second code pattern). For example, as shown in FIG. 13, in the eleventh light blocking member BK11, the center of an area of the eleventh main light blocking member BK_M11 may be the same as the center of an area of the eleventh auxiliary light blocking member BK_S11, which overlaps the eleventh main blocking member BK_M11.

For example, based on a virtual line closest to the light blocking member among the virtual lines L_H1, L_H2, L_V1, and L_V2, the main light blocking member (the first light blocking member or the first code pattern) and the auxiliary light blocking member (the second light blocking member or the second code pattern) may be positioned in the same direction and may be spaced apart from the virtual line by the same distance. For example, as shown in FIG. 13, in the eleventh light blocking member BK11, the eleventh main light blocking member BK_M11 and the eleventh auxiliary light blocking member BK_S11 may be positioned on the right side of the first vertical line L_V1, and the eleventh main light blocking member BK_M11 and the eleventh auxiliary light blocking member BK_S11 (or centers of their areas) may be positioned at the same distance from the first vertical line L_V1.

In another embodiment, the center of the area of the main light blocking member (the first light blocking member or the first code pattern) may be different from the center of the area of the auxiliary light blocking member (the second light blocking member or the second code pattern). For example, as shown in FIG. 15, in the eleventh light blocking member BK11, the eleventh main light blocking member BK_M11 overlaps the eleventh auxiliary light blocking member BK_S11. However, the center of the area of the eleventh main light blocking member BK_M11 may be different from the center of the area of the eleventh auxiliary light blocking member BK_S11.

In other words, based on a virtual line closest to the light blocking member among the virtual lines L_H1, L_H2, L_V1, and L_V2, the main light blocking member (the first light blocking member or the first code pattern) and the auxiliary light blocking member (the second light blocking member or the second code pattern) may be positioned in the same direction and may be spaced apart from the virtual line by different distances. For example, as shown in FIG. 15, in the eleventh light blocking member BK11, the eleventh main light blocking member BK_M11 and the center of the eleventh auxiliary light blocking member BK_S11 may be positioned on the right side of the first vertical line L_V1, and the center of the eleventh main light blocking member BK_M11 may be spaced farther apart from the first vertical line L_V1 than the eleventh auxiliary light blocking member BK_S11.

Similarly, the twelfth main light blocking member BK_M12 may be spaced farther apart from the second vertical line L_V2 than the center of the twelfth auxiliary light blocking member BK_S12. The twenty-first main light blocking member BK_M21 may be spaced farther apart from the first horizontal line L_H1 than the center of the twenty-first auxiliary light blocking member BK_S21. The twenty-second main light blocking member BK_M22 may be spaced farther apart from the second horizontal line L_H2 than the center of the twenty-second auxiliary light blocking member BK_S22.

In consideration of the different sizes of the emission areas EA1 to EA3 shown in FIG. 6, the positions of the main light blocking members BK_M11 to BK_M22 having a relatively large line width may be variously changed.

Figure 16:
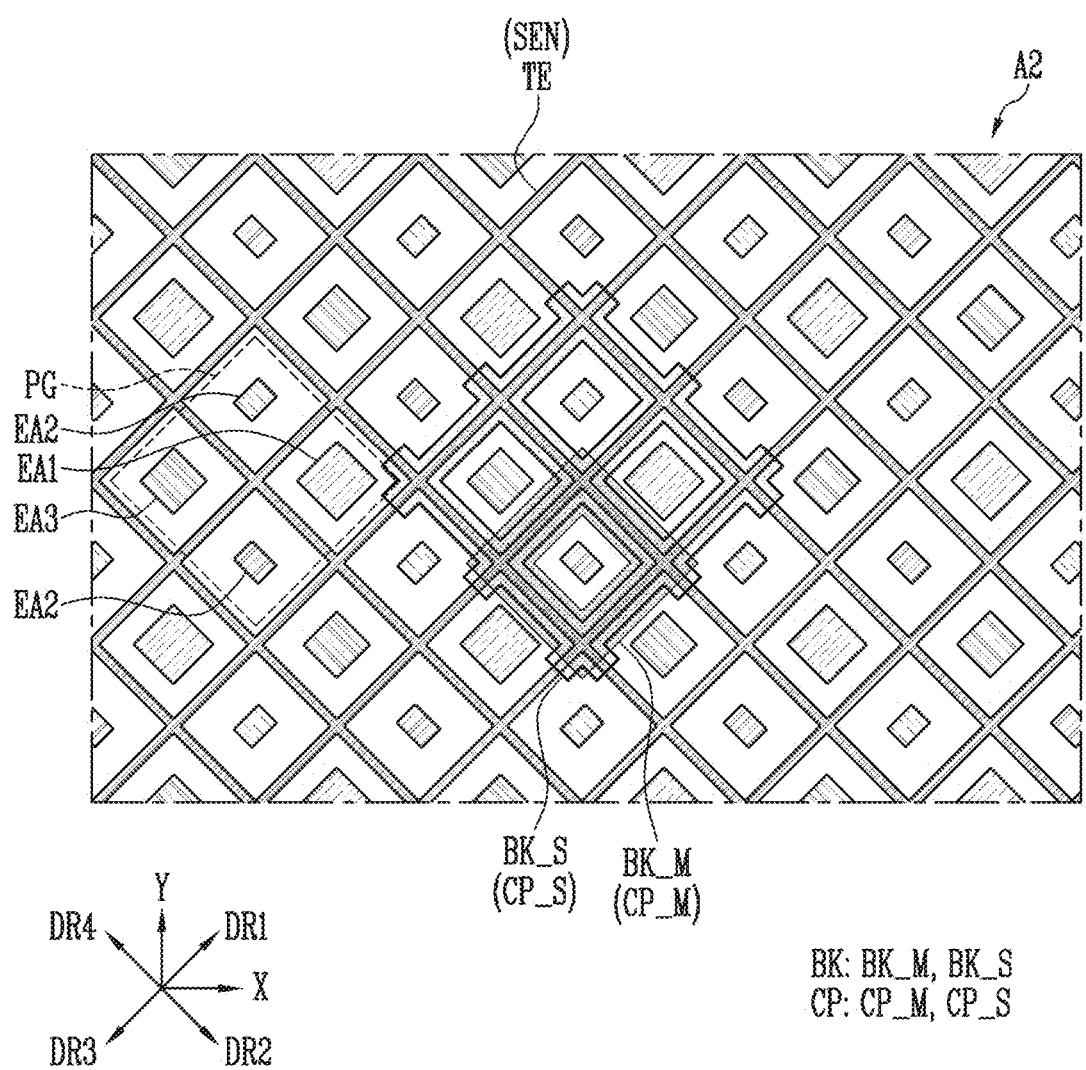
FIG. 16 is a plan view illustrating another embodiment of the display device in which an area A2 of FIG. 4 is enlarged.

FIG. 16 is a plan view illustrating another embodiment of the display device in which an area A2 of FIG. 4 is enlarged.

Referring to FIGS. 8 and 16, except for the shape of the light blocking member BK (or the code pattern CP) or the arrangement position of the first light blocking member BK_M (or the first code pattern CP_M), the embodiment of FIG. 16 may be substantially the same as or similar to the embodiment of FIG. 8. Therefore, a description of the configuration described with reference to FIG. 8 will be omitted.

The code pattern CP may include the first code pattern CP_M (or main code pattern) and the second code pattern CP_S (or auxiliary code pattern). The light blocking member BK may include the first light blocking member BK_M (or the first part) corresponding to the first code pattern CP_M and the second light blocking member BK_S (or the second part) corresponding to the second code pattern CP_S.

In an embodiment, the first code pattern CP_M and the second code pattern CP_S may have the same or similar planar shape. For example, the second code pattern CP_S may include a closed-loop portion surrounding at least one of the first to third emission areas EA1, EA2, and EA3 when viewed on a plane, and may have a rhombic planar shape as a whole. Similarly, the first code pattern CP_M may include a closed-loop portion surrounding one of the first to third emission areas EA1, EA2, and EA3, and may have a rhombic planar shape as a whole. When the first code pattern CP_M has a closed-loop shape, compared to a dot shape or a line shape as previously discussed, identification sensitivity of the first code pattern CP_M (and the code pattern CP including the same) can be further improved. The shape (and size) of the first code pattern CP_M may be different in other embodiments. In this case, the shape (and size) of the first code pattern CP_M may be variously changed within a range that reduces or minimizes the light emitting characteristics of the display device 10.

Figure 17:
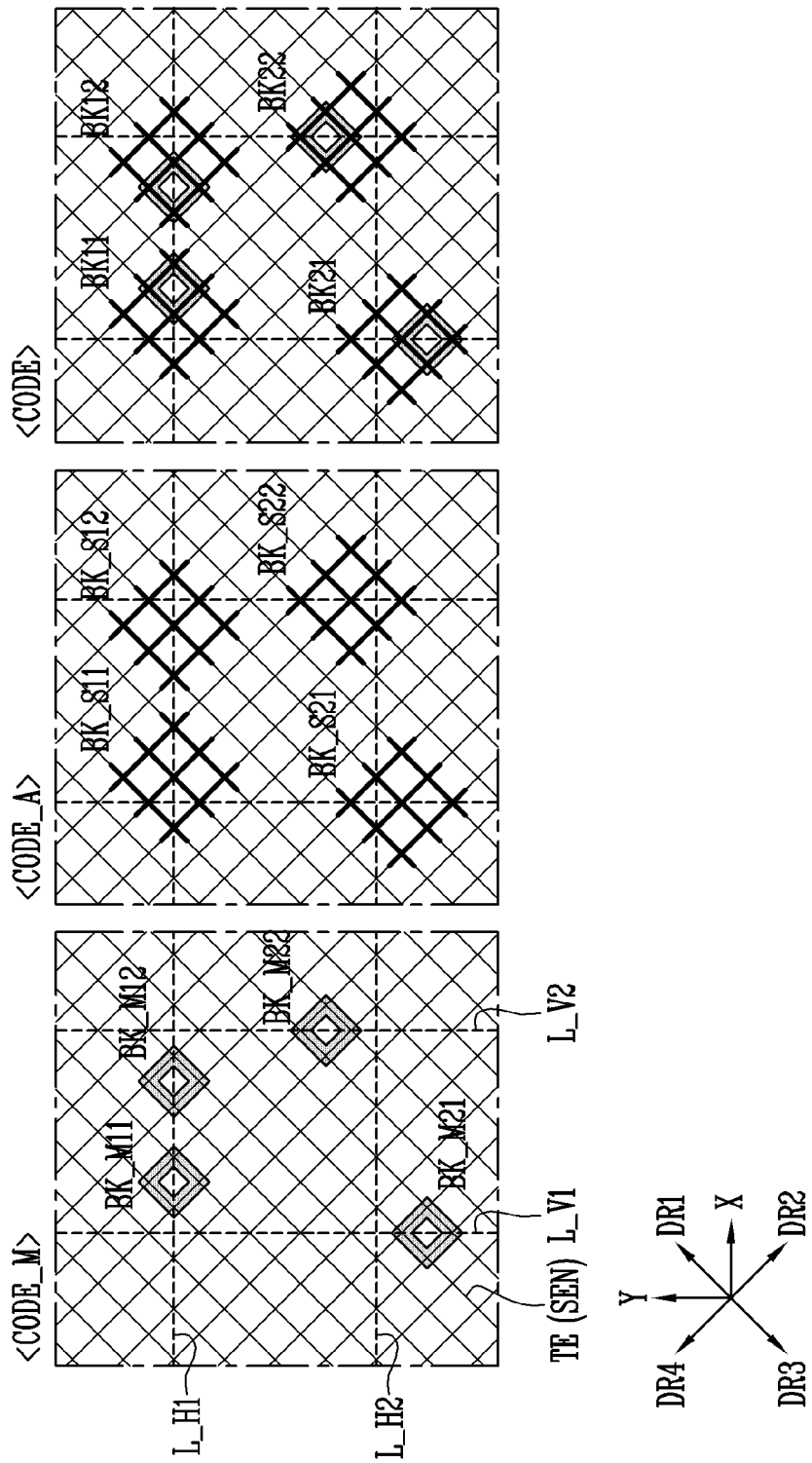
FIG. 17 is a plan view for explaining a position code according to an arrangement of light blocking members according to an embodiment.

FIG. 17 is a plan view for explaining a position code according to an arrangement of light blocking members according to an embodiment.

Referring to FIGS. 14, 15, and 17, except for the shapes of the main light blocking members BK_M11 to BK_M22 (first light blocking members or first code patterns), the embodiment of FIG. 17 may be substantially the same as or similar to the embodiment of FIG. 15. Therefore, a description of the configuration described with reference to FIGS. 14 and 15 will be omitted. Since each of the main light blocking members BK_M11 to BK_M22 is substantially the same as or similar to the first light blocking member BK_M described with reference to FIG. 16, duplicate descriptions will be omitted.

As shown in FIG. 17, the center of the area of the main light blocking member (the first light blocking member or the first code pattern) may be different from the center of the area of the auxiliary light blocking member (the second light blocking member or the second code pattern). For example, in the eleventh light blocking member BK11, the center of the area of the eleventh main light blocking member BK_M11 may be different from the center of the area of the eleventh auxiliary light blocking member BK_S11.

Based on a virtual line closest to the light blocking member among the virtual lines L_H1, L_H2, L_V1, and L_V2, the main light blocking member (the first light blocking member or the first code pattern) and the auxiliary light blocking member (the second light blocking member or the second code pattern) may be positioned in the same direction and may be spaced apart from the virtual line by different distances. For example, in the eleventh light blocking member BK11, the eleventh main light blocking member BK_M11 and the center of the eleventh auxiliary light blocking member BK_S11 may be positioned on the right side of the first vertical line L_V1. In this case, the eleventh main light blocking member BK_M11 may be spaced farther apart from the first vertical line L_V1 than the eleventh auxiliary light blocking member BK_S11.

Similarly, the twelfth main light blocking member BK_M12 may be spaced farther apart from the second vertical line L_V2 than the center of the twelfth auxiliary light blocking member BK_S12. The twenty-first main light blocking member BK_M21 may be spaced farther apart from the first horizontal line L_H1 than the center of the twenty-first auxiliary light blocking member BK_S21. The twenty-second main light blocking member BK_M22 may be spaced farther apart from the second horizontal line L_H2 than the center of the twenty-second auxiliary light blocking member BK_S22.

Figure 18:
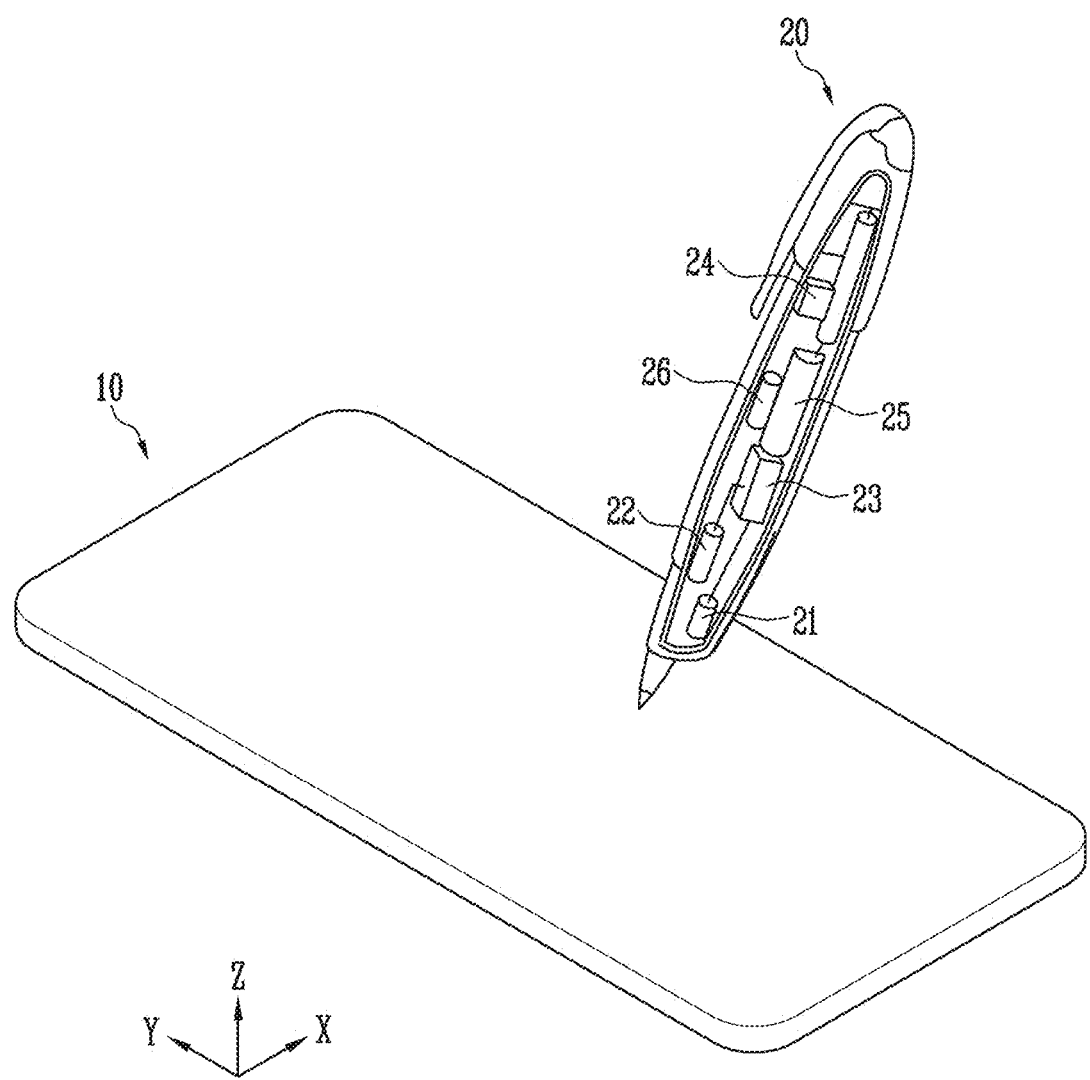
FIG. 18 is a perspective view illustrating a touch input system according to embodiments.
Figure 19:
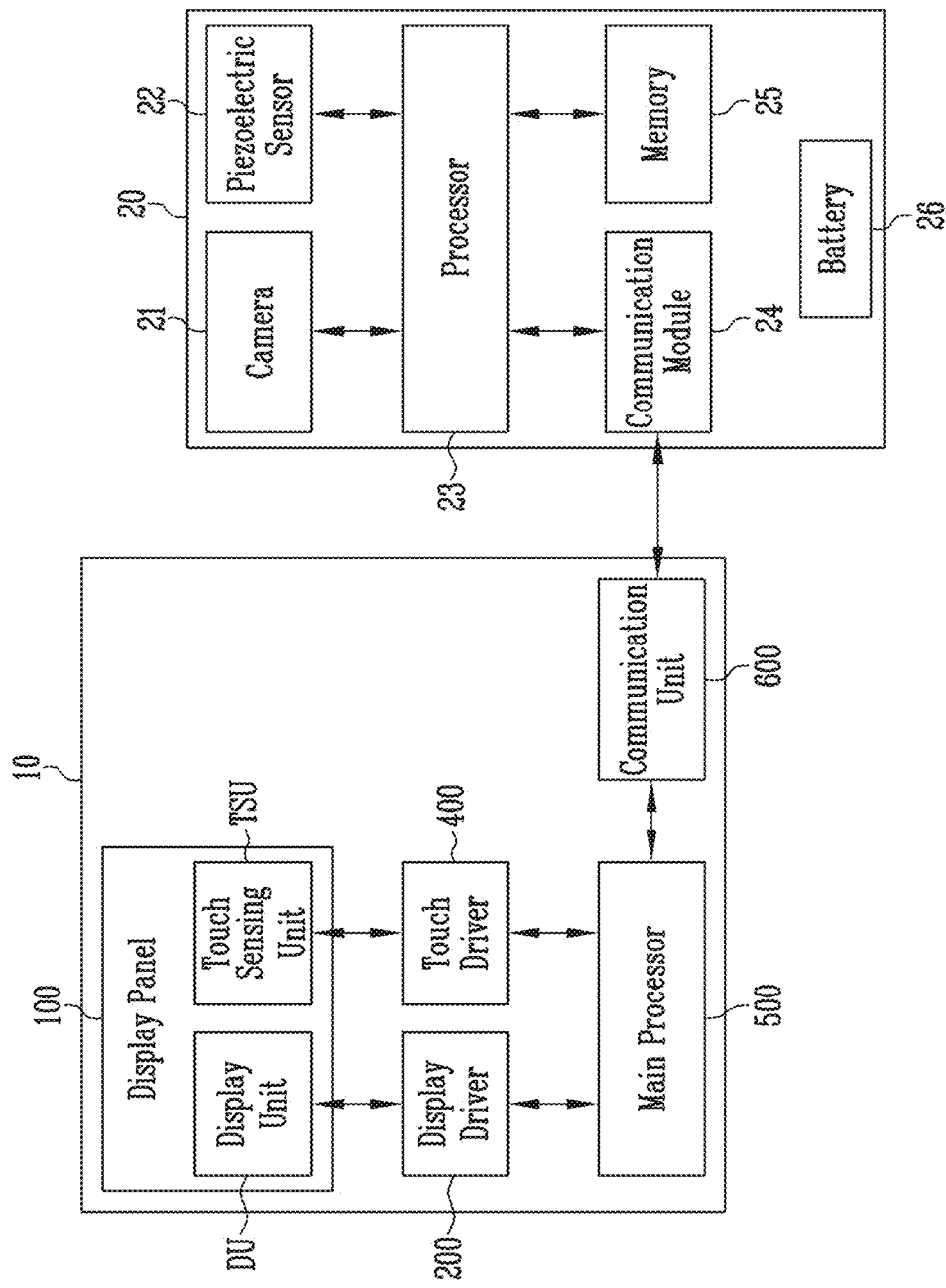
FIG. 19 is a block diagram illustrating a display device and a touch input device included in the touch input system of FIG. 18 according to an embodiment.

FIG. 18 is a perspective view illustrating a touch input system according to embodiments. FIG. 19 is a block diagram illustrating an embodiment of a display device and a touch input device included in the touch input system of FIG. 18.

Referring to FIGS. 18 and 19, the touch input system may include a display device 10 and an input device 20. The display device 10 may include a display panel 100, a display driver 200, a touch driver 400, a main processor 500, and a communication unit 600.

The display panel 100 may include a display unit DU and a touch sensing unit TSU. The display unit DU may include a plurality of pixels for displaying an image.

The touch sensing unit TSU may include a plurality of touch electrodes SEN to sense a user's input (e.g., a touch by a user's finger or stylus) in a capacitive manner. The display device 10 may sense a touch of the input device 20 by including a code pattern CP (e.g., refer to FIGS. 8 and 16). The code pattern CP may have location information determined by the planar shape, arrangement, and the like of a light blocking member BK. At least one code pattern CP or a combination of code patterns CP may correspond to a value of a predetermined data code.

The display driver 200 may output signals and voltages for driving the display unit DU. The display driver 200 may supply data voltages to data lines. The display driver 200 may supply a power source voltage to a power source line and may supply gate control signals to a gate driver.

The touch driver 400 may be connected to the touch sensing unit TSU. The touch driver 400 may supply a touch driving signal to the plurality of touch electrodes SEN of the touch sensing unit TSU and sense an amount of change in capacitance between the plurality of touch electrodes SEN. The touch driver 400 may sense whether there is a user's input based on the change amount of capacitance between the plurality of touch electrodes SEN and calculate input coordinates.

The main processor 500 may control operation of the display device 10. For example, the main processor 500 may supply digital video data to the display driver 200 so that the display panel 100 displays an image. For example, the main processor 500 may receive touch data from the touch driver 400 to determine the user's input coordinates, and then may generate the digital video data according to the input coordinates or execute an application indicated by an icon displayed at the user's input coordinates. For another example, the main processor 500 may receive coordinate data from the input device 20 to determine the input coordinates of the input device 20, and then generate the digital video data according to the input coordinates or execute an application indicated by an icon displayed at the input coordinates of the input device 20.

The communication unit 600 may perform wired/wireless communication with an external device. For example, the communication unit 600 may transmit and receive communication signals to and from a communication module 24 of the input device 20. The communication unit 600 may receive coordinate data composed of data codes from the input device 20 and provide the coordinate data to the main processor 500.

The input device 20 may include a camera 21, a piezoelectric sensor 22, a processor 23, the communication module 24, a memory 25, and a battery 26. For example, the input device 20 may be an input pen that generates the coordinate data using an optical method. The input pen may be a smart pen, an electromagnetic pen, or an active pen, but the present invention is not limited thereto.

The camera 21 may be disposed in front of the input device 20. The camera 21 may capture the code pattern CP. The camera 21 may continuously capture the code pattern CP at a corresponding position along the movement of the input device 20. The camera 21 may provide the captured image to the processor 23.

The piezoelectric sensor 22 may sense pressure applied to the display device 10 by the input device 20. The piezoelectric sensor 22 may provide pressure information of the input device 20 to the processor 23.

The processor 23 may receive an image of the code pattern CP captured by the camera 21. The processor 23 may convert the code pattern CP into a corresponding data code, and may generate the coordinate data by combining data codes. The processor 23 may transmit the generated coordinate data to the display device 10 through the communication module 24.

The processor 23 may quickly generate the coordinate data without complex calculations and corrections by receiving the image of the code pattern CP and converting at least one code pattern CP (or a combination of code patterns CP) into the data code in a one-to-one manner. Accordingly, the touch input system may perform a corresponding function based on accurate input coordinates, reduce cost and power consumption, and simplify a driving process. In addition, the touch input system may not be limited in size and may be applied to all electronic devices having a touch function by including the plurality of code patterns CP provided on a touch sensing layer TSU, a color filter layer CFL, or a wavelength conversion layer WLCL.

The communication module 24 may perform wired/wireless communication with an external device. For example, the communication module 24 may transmit and receive the communication signals to and from the communication unit 600 of the display device 10. The communication module 24 may receive the coordinate data composed of data codes from the processor 23 and may provide the coordinate data to the communication unit 600.

The memory 25 may store data used to drive the input device 20. The input device 20 may convert at least one code pattern CP (or a combination of code patterns CP) into the data code in a one-to-one manner, and directly provide the coordinate data to the display device 10. Therefore, the memory 25 having a relatively small capacity can be included.

In the display device and the touch input system according to the embodiments of the present invention, the light blocking member (that is, the code pattern having location information) may include a first part and a second part having different line widths. The input device may quickly generate the input coordinates using the light blocking member.

In addition, deterioration in light emitting characteristics of the display device can be reduced or minimized, by reducing or minimizing the size of the first part (that is, the first code pattern) having a large line width. In addition, input performance of the input device in a hovering state can be improved by using the second part (that is, the second code pattern) having a small line width.

The effects according to the embodiments of the present invention are not limited by the contents described above, and more various effects are included in the disclosure.

Although the technical spirit of the disclosure has been described in detail in accordance with the above-described embodiments, it should be noted that the above-described embodiments are for the purpose of description and not of limitation. In addition, those skilled in the art may understand that various modifications are possible within the scope of the technical spirit of the disclosure. The embodiments may be combined to form additional embodiments.

What is claimed is:
1. A display device comprising:
   a display panel including emission areas and a non-emission area between adjacent ones of the emission areas, each of the emission areas configured to emit light;
   a sensing electrode disposed on the non-emission area of the display panel; and
   a light blocking member disposed on a portion of the sensing electrode, wherein the light blocking member is configured to absorb light of a specific wavelength, and another portion of the sensing electrode that does not overlap with the light blocking member is configured to reflect light of the specific wavelength, and wherein the light blocking member includes a first part and a second part having different line widths in a first direction when viewed on a plane.

2. The display device of claim 1, wherein the light blocking member is configured to absorb an infrared ray and the sensing electrode is configured to reflect an infrared ray.

3. The display device of claim 1, wherein the light blocking member has a mesh structure that does not overlap with the emission areas of the display panel and surrounds at least one of the emission areas.

4. The display device of claim 1, wherein the light blocking member is a code pattern having location information determined by an arrangement of the light blocking member.

5. The display device of claim 4, wherein:
the code pattern includes a first code pattern and a second code pattern formed to overlap each other,
a size of the first code pattern is smaller than a size of the second code pattern, and
a line width of the first code pattern is greater than a line width of the second code pattern.

6. The display device of claim 5, wherein:
the second code pattern includes a closed loop surrounding at least one of the emission areas, and
the first code pattern does not include a closed loop.

7. The display device of claim 5, wherein a center of an area of the first code pattern corresponds to a center of an area of the second code pattern.

8. The display device of claim 5, wherein a center of an area of the first code pattern and a center of an area of the second code pattern are located at different positions.

9. The display device of claim 5, wherein:
a plurality of light blocking members including the light blocking member are substantially arranged in rows and columns when viewed on a plane, and
the location information is determined by an arrangement position of the light blocking members with respect to virtual lines corresponding to the rows and columns.

10. The display device of claim 9, wherein, based on a virtual line closest to the light blocking member among the virtual lines, the first code pattern and the second code pattern are located in a same direction and are spaced apart from the virtual line by a same distance.

11. The display device of claim 9, wherein, based on a virtual line closest to the light blocking member among the virtual lines, the first code pattern and the second code pattern are located in a same direction and are spaced apart from the virtual line by different distances.

12. The display device of claim 5, wherein each of the first code pattern and the second code pattern includes a closed loop surrounding at least one of the emission areas.

13. The display device of claim 1, wherein the display panel includes:
a substrate;
a transistor disposed on the substrate;
a light emitting element disposed on the transistor; and
an encapsulation layer disposed on the substrate to cover the light emitting element, wherein the sensing electrode is disposed on the encapsulation layer.

14. The display device of claim 13, wherein the light blocking member is disposed directly on the sensing electrode.

15. A touch input system comprising:
a display device configured to display an image; and
an input device configured to input a touch to the display device,
wherein the display device includes:
a display panel including emission areas a non-emission area between adjacent ones of the emission areas, each of the emission areas configured to emit light and;
a sensing electrode disposed on the non-emission area of the display panel; and
light blocking members disposed on a portion of the sensing electrode and spaced apart from each other, wherein each of the light blocking members includes a first part and a second part having different line widths in a first direction when viewed on a plane, and
wherein the input device is configured to capture an image of some of the light blocking members and to transmit location information determined by an arrangement of said some of the light blocking members to the display device.

16. The touch input system of claim 15, wherein:
the light blocking members are configured to absorb an infrared ray, and another portion of the sensing electrode that does not overlap with the light blocking members is configured to reflect an infrared ray, and
the input device is configured to capture the image of some of the light blocking members using an infrared ray.

17. The touch input system of claim 15, wherein the input device includes:
a camera configured to capture the image of some of the light blocking members;
a processor configured to obtain the location information by analyzing the image of some of the light blocking members; and
a transmitter configured to transmit the location information to the display device.

18. The touch input system of claim 17, wherein the display device further includes:
a receiver configured to receive the location information from the transmitter; and
a main processor configured to generate image data based on the location information, wherein the display panel is configured to display an image based on the image data.

19. The touch input system of claim 15, wherein:
each of the light blocking members includes a first light blocking member having a first line width and a second light blocking member having a second line width smaller than the first line width, and
a size of the first light blocking member is smaller than a size of the second light blocking member.

20. The touch input system of claim 19, wherein:
in a state in which the input device is in contact with the display device, the input device is configured to obtain the location information based substantially on the first light blocking member, and
in a state in which the input device is spaced apart from the display device, the input device is configured to obtain the location information based on the first light blocking member and the second light blocking member.

21. A display device comprising:
a display panel including emission areas and non-emission areas;
a code pattern disposed on at least one of the non-emission areas,
wherein the code pattern includes a first code overlapping a second code, the first code corresponding to a first light blocking area and the second code corresponding to a second light blocking area have a size different from the first light blocking area, a position of the first light blocking area and a position of a second light blocking area relative to at least one reference line indicative of a position value.

22. The display device of claim 21, wherein:
the first code has a first center;
the second code has a second center; and
the first center is coincident with the second center.

23. The display device of claim 21, wherein:
the first code has a first center;
the second code has a second center; and
the first center and the second center are at different locations.

24. The display device of claim 21, wherein the first light blocking area is between at least two adjacent emission areas of a pixel.

25. The display device of claim 24, wherein the second light blocking area surrounds the at least two adjacent emission areas of the pixel.

\* \* \* \* \*